United States Patent
Kawasaki et al.

(12) 
(10) Patent No.: US 6,771,108 B2
(45) Date of Patent: Aug. 3, 2004

(54) INPUT CIRCUIT AND SEMICONDUCTOR INTEGRATED CIRCUIT HAVING THE INPUT CIRCUIT

(75) Inventors: Kenichi Kawasaki, Kawasaki (JP);
Yasuharu Sato, Kawasaki (JP);
Yasurou Matsuzaki, Kawasaki (JP);
Takaaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/152,614

(22) Filed: May 23, 2002

(65) Prior Publication Data

US 2003/0062942 A1 Apr. 3, 2003

Related U.S. Application Data

(62) Division of application No. 09/344,810, filed on Jun. 25, 1999, now Pat. No. 6,433,607, which is a continuation of application No. 09/109,899, filed on Jul. 2, 1998, now abandoned.

(30) Foreign Application Priority Data

Jan. 21, 1998 (JP) .......................................... 10-009533
Jan. 20, 1999 (JP) .......................................... 11-012184

(51) Int. Cl.$^7$ ................................................ H03K 3/00
(52) U.S. Cl. ........................ 327/299; 327/109; 365/195
(58) Field of Search ................................. 327/299, 109, 327/161, 291, 155–159; 365/222, 191, 193, 195, 196, 189.05, 189.01, 233, 233.5

(56) References Cited

U.S. PATENT DOCUMENTS

| | | | | |
|---|---|---|---|---|
| 4,935,900 A | * | 6/1990 | Ohsawa | 365/222 |
| 5,321,662 A | * | 6/1994 | Ogawa | 365/222 |
| 5,402,389 A | | 3/1995 | Flannagan et al. | 365/233 |
| 5,619,457 A | * | 4/1997 | Hayakawa et al. | 365/189.05 |
| 5,629,897 A | | 5/1997 | Iwamoto et al. | 365/195 |
| 5,793,680 A | | 8/1998 | Okajima | 365/189.05 |
| 6,037,813 A | | 3/2000 | Eto et al. | 327/156 |
| 6,192,429 B1 | | 2/2001 | Jeong et al. | 710/58 |

FOREIGN PATENT DOCUMENTS

| | | |
|---|---|---|
| JP | 06075657 | 3/1994 |
| JP | 09198866 | 7/1997 |

* cited by examiner

*Primary Examiner*—Minh Nguyen
(74) *Attorney, Agent, or Firm*—Arent Fox PLLC

(57) ABSTRACT

An input circuit has an input buffer and a detection circuit. The input buffer receives an external signal and outputs an internal signal. The detection circuit detects whether or not the external signal is provided. The input buffer outputs the internal signal when an output of the detection circuit indicates that the external signal is provided. This arrangement shortens the lock-on time of an internal circuit (synchronous circuit).

50 Claims, 43 Drawing Sheets

DECREMENT

SUSTAIN

INCREMENT

INPUT CIRCUIT AND SEMICONDUCTOR INTEGRATED CIRCUIT HAVING THE INPUT CIRCUIT

CROSS REFERENCE TO RELATED APPLICATION

This is a Division of application Ser. No. 09/344,810 filed Jun. 25, 1999, now U.S. Pat. No. 6,433,607, which in turn is a Continuation Application of Parent application Ser. No. 09/109,899 filed Jul. 2, 1998, now ABANDONED. The disclosure of the prior applications is hereby incorporated by reference herein in its entirety.

BACKGROUND OF THE INVENTION

1. Field of the Invention

The present invention relates to an input circuit and a semiconductor integrated circuit having the input circuit, and more particularly to an input circuit applicable to a semiconductor integrated circuit having a delay locked loop (DLL) circuit that needs a long lock-on time.

2. Description of the Related Art

Recent high-speed, highly-integrated semiconductor circuits require a phase-locked clock signal for controlling objective circuits. For example, a synchronous dynamic random access memory (SDRAM), which operates at a high speed of 100 MHz or over, employs a DLL circuit to supply a signal whose phase is synchronized with an external clock signal, to output circuits or output buffers.

By the way, it is strongly required to reduce the power consumption of semiconductor integrated circuits such as SDRAMs. One technique of reducing the power consumption of an SDRAM is to deactivate an input circuit of the SDRAM while the SDRAM is in a self-refresh mode.

Namely, the input circuit of the SDRAM is stopped in response to a self-refresh mode signal to reduce power consumption during a self-refresh mode. Note that circumferential conditions may change before and after the self-refresh mode. For example, a power source voltage and ambient temperature may greatly change before and after the self-refresh mode. In this case, the DLL circuit that receives an output of the input circuit spends (needs) many dummy cycles to restore a lock-on (steady) state. Such dummy cycles waste time.

Prior and related arts and the problems thereof will be explained later with reference to accompanying drawings.

SUMMARY OF THE INVENTION

An object of the present invention is to shorten the lock-on time of an internal circuit or a synchronous circuit. Another object of the present invention is to speedily establish a steady state of a DLL circuit without dummy cycles after the completion of a self-refresh operation.

According to the present invention, there is provided an input-circuit comprising an input buffer for receiving an external signal (external control signal) and outputting an internal signal (internal control signal); and a detection circuit for detecting whether or not the external signal is provided, wherein the input buffer outputs the internal signal when an output of the detection circuit indicates that the external signal is provided.

The internal signal may be supplied to an internal circuit that spends (requires) a predetermined time to establish a steady state. The internal circuit may be a delay locked loop circuit.

Further, according to the present invention, there is also provided a semiconductor integrated circuit having an input circuit for receiving an external clock signal and outputting an internal clock signal, and an internal circuit that receives the internal clock signal and spends a predetermined time to establish a steady state, wherein the input circuit comprises an input buffer for generating the internal clock signal from the external clock signal; and a detection circuit for detecting whether or not the external clock signal is provided, wherein the input buffer outputs the internal clock signal when an output of the detection circuit indicates that the external clock signal is provided.

The semiconductor integrated circuit may be a synchronous dynamic random access memory, and the internal circuit may be a delay locked loop circuit for controlling an output timing of an output circuit that outputs data in synchronization with the external clock signal. The input circuit may further comprise an internal oscillator for generating pulses at predetermined intervals during a self-refresh mode, to carry out a self-refresh operation, the input buffer may output the internal clock signal during the self-refresh mode when the external clock signal is provided, and the input buffer may be deactivated when the external clock signal is stopped.

The delay locked loop circuit may comprise a delay circuit for receiving the internal clock signal, delaying the internal clock signal by a predetermined amount, and outputting the delayed signal; a dummy delay circuit for receiving the internal clock signal, delaying the internal clock signal by the same amount as that of the delay circuit, and outputting the delayed signal; a delay control circuit for providing the delay circuit and dummy delay circuit with the same delay amount; and a phase comparison circuit for receiving a reference signal corresponding to the internal clock signal and an objective signal made by passing the output of the dummy delay circuit through predetermined circuits, and supplying pulses whose number corresponds to a phase difference between the reference signal and the objective signal, to the delay control circuit to control the delay amount of the delay circuit and the dummy delay circuit.

The delay locked loop circuit may further comprise a frequency divider that receives the internal clock signal and outputs an output signal to the dummy delay circuit and the reference signal to the phase comparison circuit.

According to the present invention, there is provided an input circuit comprising an input buffer for receiving an external control signal and providing an internal control signal; and a timing signal generator for generating a timing signal, wherein the input buffer provides the internal control signal for a predetermined period in response to the timing signal.

According to the present invention, there is also provided a semiconductor integrated circuit comprising an input circuit for receiving an external clock signal and providing an internal clock signal; and an internal circuit that receives the internal clock signal and takes a predetermined time to establish a steady state, wherein the input circuit includes an input buffer for generating the internal clock signal from the external control signal and a timing signal generator for generating a timing signal; and the input buffer provides the internal clock signal for a predetermined period in response to the timing signal.

The timing signal generator may include an oscillator. The timing signal generator may further include a frequency divider. The frequency divider may change a frequency dividing ratio after a predetermined period. The frequency divider may lower a frequency of the timing signal as time passes. The timing signal generator may further include a pulse width adjuster for adjusting a pulse width of the timing signal.

The input circuit may further comprise an internal control signal output unit for receiving the internal control signal from the input buffer and providing the internal control signal for internal circuits; and a synchronous circuit for receiving the internal control signal from the input buffer and providing the internal control signal output unit with a timing signal synchronized with the internal control signal.

The semiconductor integrated circuit may be a synchronous DRAM and the oscillator may serve as a self-refresh oscillator. The timing signal generator may not generate a timing signal during a self-refresh operation.

Further, according to the present invention, there is provided an input circuit comprising an input buffer for receiving an external control signal and providing an internal control signal; a timing signal generator for generating a timing signal; and a control signal detection circuit for providing a detection signal indicating whether or not the external control signal is activated, wherein the input buffer provides the internal control signal according to the timing signal and the detection signal.

Further, according to the present invention, there is also provided a semiconductor integrated circuit comprising an input circuit for receiving an external clock signal and providing an internal clock signal; and an internal circuit that receives the internal clock signal and takes a predetermined time to establish a steady state, wherein the input circuit includes an input buffer for providing the internal clock signal according to the external clock signal, a timing signal generator for generating a timing signal, and a clock signal detection circuit for providing a detection signal indicating whether or not the external clock signal is activated; and the input buffer provides the internal clock signal according to the timing signal and the detection signal.

The input buffer may provide the internal clock signal for a predetermined period and then may stop the internal clock signal in response to the timing signal. The input circuit may include a synchronous circuit for synchronizing the timing signal with the detection signal. The clock signal detection circuit may be stopped in response to the timing signal.

The timing signal generator may include an oscillator. The timing signal generator may further include a frequency divider. The frequency divider may change a frequency dividing ratio after a predetermined period. The frequency divider may lower a frequency of the timing signal as time passes. The timing signal generator may further include a pulse width adjuster for adjusting a pulse width of the timing signal. The timing signal generator may generate the timing signal by lowering a frequency of the external clock signal.

In addition, according to the present invention, there is provided an input circuit comprising an input buffer for receiving an external control signal and providing an internal control signal; a timing signal generator for generating a timing signal; and a control signal detection circuit for providing a detection signal indicating whether or not the external control signal is activated, wherein the input buffer provides the internal control signal according to the timing signal and the detection signal; and the internal control signal is started and stopped in response to the timing signal.

Further, according to the present invention, there is also provided a semiconductor integrated circuit comprising an input circuit for receiving an external clock signal and providing an internal clock signal; and an internal circuit that receives the internal clock signal and takes a predetermined time to establish a steady state, wherein the input circuit includes an input buffer for providing the internal clock signal according to the external clock signal, a timing signal generator for generating a timing signal, and a clock signal detection circuit for providing a detection signal indicating whether or not the external clock signal is activated; the input buffer provides the internal clock signal according to the detection signal; and the internal clock signal is started and stopped in response to the timing signal.

The input circuit may further include an input buffer controller for generating an input buffer control signal according to the detection signal; the input buffer may provide the internal clock signal according to the input buffer control signal; and the input buffer controller may include a latch, generate the input buffer control signal according to the detection signal, latch the same, and release the latched state according to the timing signal. The timing signal generator may start to operate in response to the detection signal and stop to operate after providing the timing signal. The timing signal generator may include an oscillator. The timing signal generator may generate the timing signal by lowering a frequency of the external clock signal.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, a semiconductor integrated circuit according to the related art and the problem thereof will be explained.

Recent memory devices can operate at a high speed of 100 MHz or over and employ a DLL circuit to lock the phase of an internal clock signal with respect to the phase of an external clock signal and to cancel delays and fluctuations in access timing due to internal clock wiring.

The DLL circuit employs a dummy clock line for estimating a propagation delay due to the load of the internal clock wiring.

Figure 1:
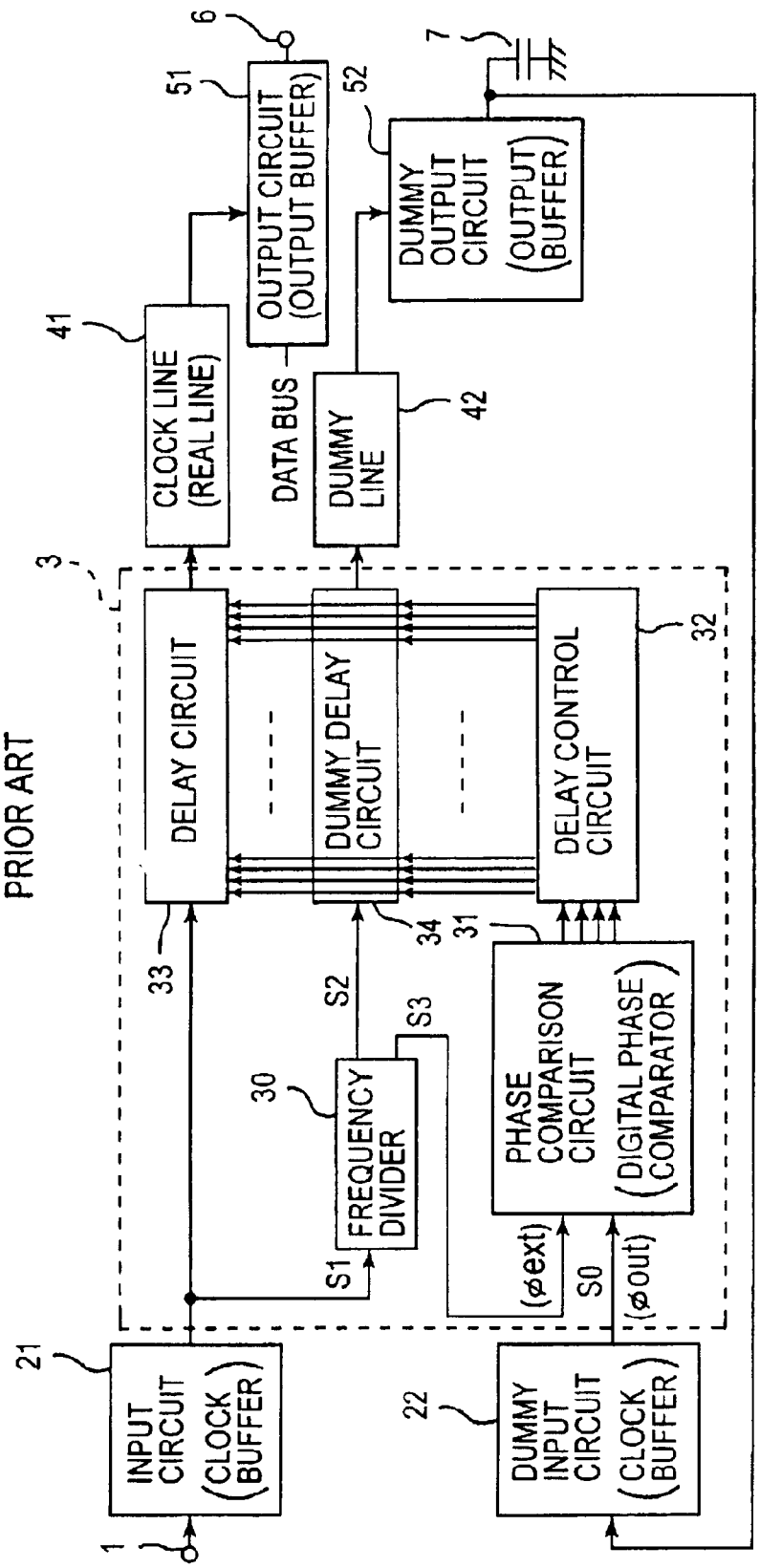
FIG. 1 shows a semiconductor integrated circuit according to a related art.

FIG. 1 shows a semiconductor integrated circuit according to the related art. The circuit has a clock input pad 1, an input circuit 21, a dummy input circuit 22, a DLL circuit 3, a real clock line 41, a dummy clock line 42, an output circuit (an output buffer) 51, a dummy output circuit (a dummy output buffer) 52, a data output pad 6, and a dummy load capacitor 7.

The DLL circuit 3 has a frequency divider 30, a phase comparison circuit 31, a delay control circuit 32, a delay circuit 33, and a dummy delay circuit 34. The frequency divider 30 receives a signal S1 that corresponds to an external clock signal CLK, from the input circuit 21, divides the frequency of the signal S1, and provides frequency-divided signals S2 and S3. The signal S2 is supplied to the dummy delay circuit 34, and the signal S3 is supplied to a first input terminal of the phase comparison circuit 31. A second input terminal of the circuit 31 receives a signal S0, which is prepared by passing the signal S2 through the dummy delay circuit 34, dummy clock line 42, dummy output circuit 52, and dummy input circuit 22. The phase comparison circuit 31 compares the phases of the signals S0 and S3 and controls the delay control circuit 32 accordingly. The output of the delay circuit 33 is the output of the DLL circuit 3, which is passed through the real clock line 41 to the output circuit (an objective circuit) 51.

In a usual operation, the signal S0 supplied to the phase comparison circuit 31 is delayed behind the external clock signal CLK by, for example, one clock period due to the dummy clock line 42, dummy output circuit 52, dummy input circuit 22, etc. The phase comparison circuit 31 compares the phase of the delayed signal S0 ($\phi$out) with the phase of the signal S3 ($\phi$ext). The phase comparison circuit 31 provides a result of comparison according to which the delay control circuit 32 controls the delay circuit 33 and dummy delay circuit 34 by giving them an identical delay. As a result, a clock signal to the output circuit 51 apparently involves no delay with respect to the external clock signal CLK, even if there is a delay due to the input circuit 21, delay circuit 33, real clock line 41, and output circuit 51.

If a clock period is shorter than the delay caused by the input circuit 21, output circuit 51, real clock line 41, etc., the DLL circuit 3 is unable to generate an internal clock pulse from a preceding pulse of the external clock signal CLK. Accordingly, if a clock period is shorter than a delay caused by wiring, etc., the DLL circuit 3 generates an internal clock pulse from a second preceding pulse of the external clock signal CLK. Namely, the phase comparison circuit 31 compares two clock signals with one being behind the other by two clock periods.

More precisely, the frequency divider 30 and phase comparison circuit 31 synchronize a rising edge of a clock signal from the DLL circuit 3 with a rising edge of a signal that is delayed behind the external clock signal CLK by two clock periods. Even if the phases of the signals S1 and S0 are shifted from each other by, for example, 180 degrees, the signals S3 and S0 supplied to the phase comparison circuit 31 have a common high-level duration due to the frequency divider 30. As a result, the phase comparison circuit 31 is able to compare the phases of the signals S3 and S0 with each other.

Figure 2:
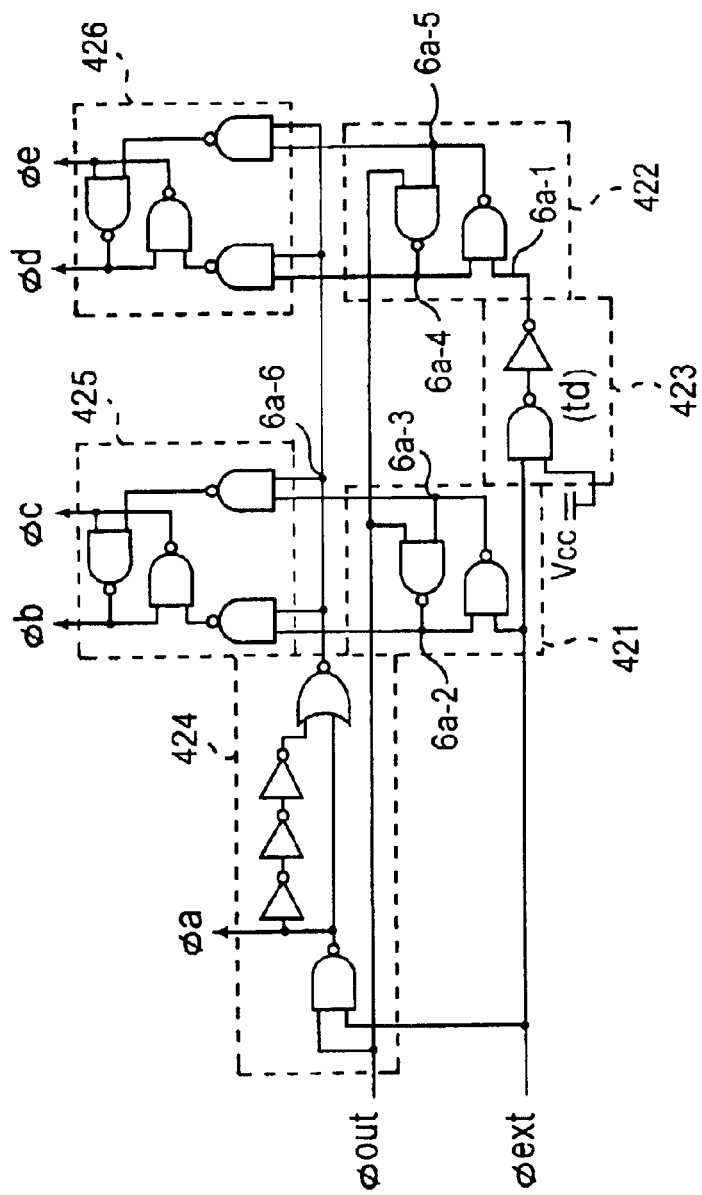
FIG. 2 shows a phase comparison section of a phase comparison circuit of the semiconductor integrated circuit of FIG. 1.

FIG. 2 shows a phase comparison section of the phase comparison circuit 31 of FIG. 1, and FIGS. 3A, 3B, and 3C are timing charts showing the operation of the phase comparison section of FIG. 2.

Figure 4:
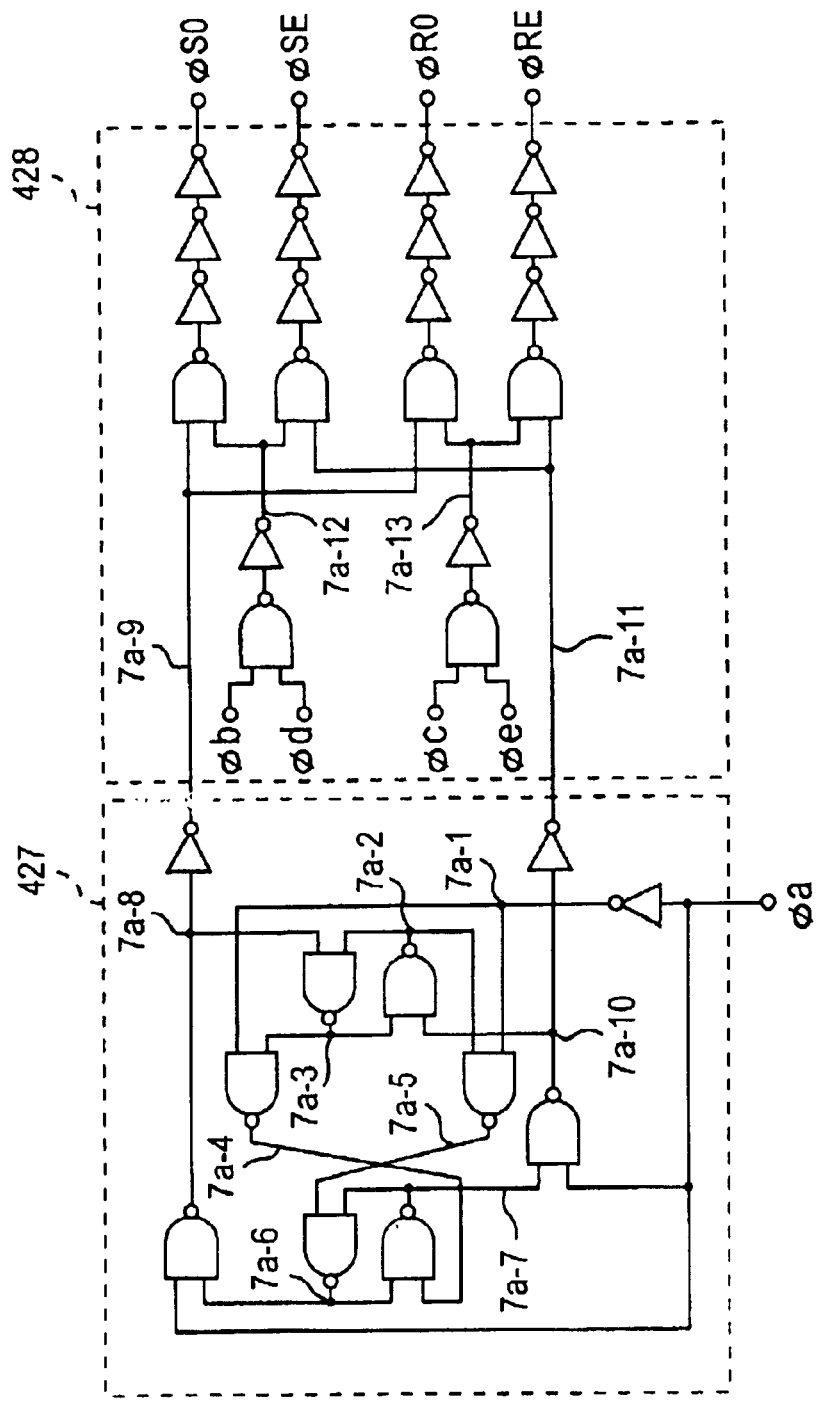
FIG. 4 shows an amplification section of the phase comparison circuit of FIG. 1.

The phase comparison circuit 31 consists of the phase comparison section of FIG. 2 and an amplification section of FIG. 4. In FIG. 2, the phase comparison section compares the phase of the dummy internal clock signal φout with the phase of the signal φext serving as a reference signal, and provides output signals φa to φe to the amplification section.

The phase comparison section is composed of flip-flops 421 and 422 each having two NAND gates, latches 425 and 426 for latching the states of the flip-flops 421 and 422, respectively, a generator 424 for generating an activation signal for the latches 425 and 426, and a unit-delay circuit 423 for obtaining a phase allowance for the signal φext.

Figure 3C:
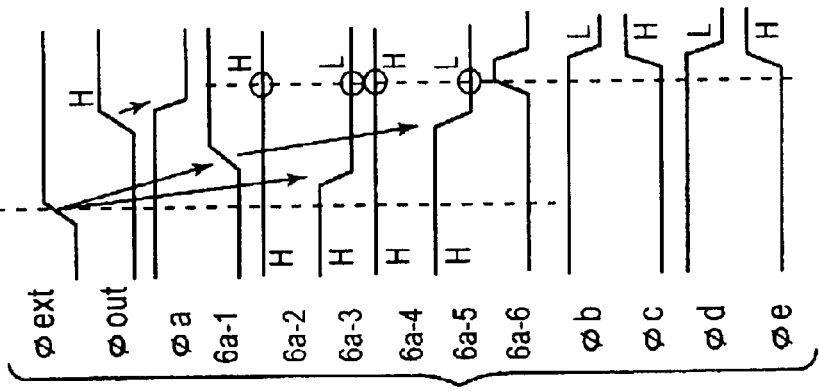
FIGS. 3A, 3B, and 3C are timing charts showing the operation of the phase comparison section of FIG. 2.
Figure 3B:
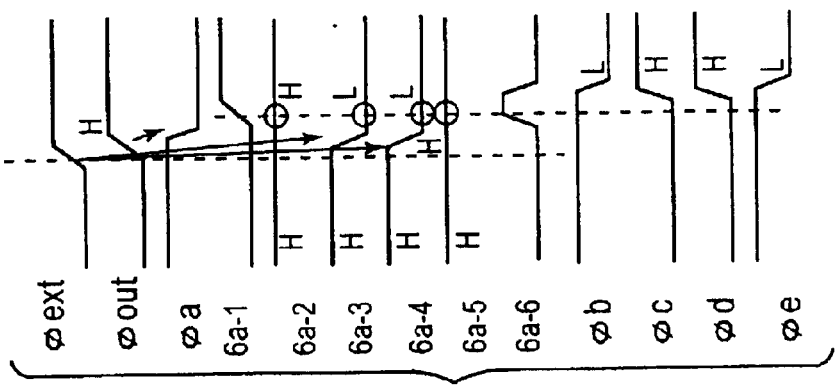
Figure 3A:
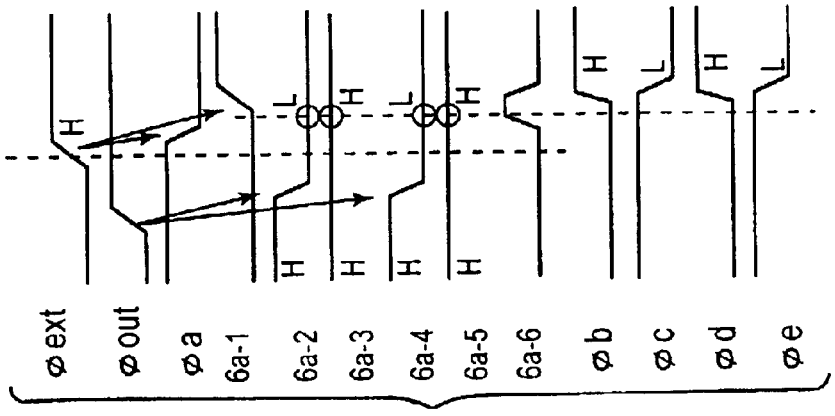

FIG. 3A shows that the phase of the dummy internal clock signal φout is ahead of the phase of the reference signal φext. Namely, the signal φout changes from low to high before the signal φext shows the same change. When the signals φout and φext are each at low level, nodes 6a-2 to 6a-5 of the flip flops 421 and 422 are each high. When the signal φout changes from low to high, the nodes 6a-2 and 6a-4 change from high to low. Thereafter, the signal φext changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal φext changes from low to high, the output signal φa of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flips 421 and 422. As a result, the output signal φb changes to high, φc to low, φd to high, and φe to low.

FIG. 3B shows that the dummy internal clock signal φout and reference signal φext have substantially the same phase and change from low to high substantially at the same time. Within a time difference between a rise of the signal φout and a rise of the node 6a-1, the signal φout changes from low to high. At this time, the signal φext changes from low to high, so that the node 6a-3 of the flip-flop 421 changes from high to low. In the flip-flop 422, the node 6a-1 maintains low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and be to low.

FIG. 3C shows that the phase of the dummy internal clock signal φout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, φd to low, and φe to high.

In this way, a rise of the reference signal φext is used to determine whether a rise of the dummy internal clock signal φout is ahead, simultaneous, or behind. The determination is latched as levels of the output signals φb, φc, φd, and φe. According to these levels, it is possible to increment or decrement a delay in the delay control circuit 32.

Figure 5:
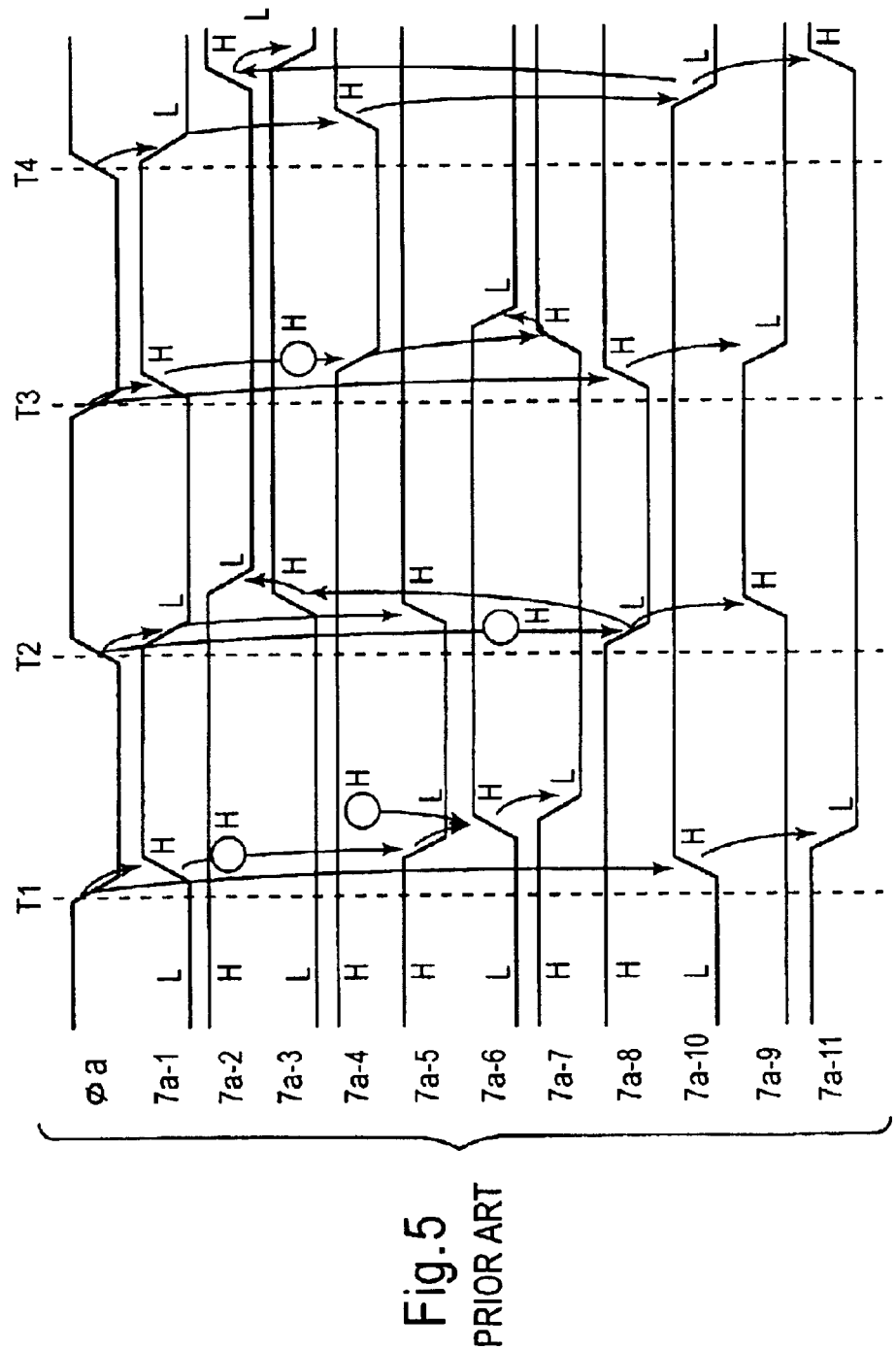
FIG. 5 is a timing chart showing the operation of a JK flip-flop of the amplification section of FIG. 4.

FIG. 4 shows the amplification section of the phase comparison circuit 31 of FIG. 1, and FIG. 5 is a timing chart showing the operation of a JK flip-flop 427 of the amplification section of FIG. 4.

The amplification section has the JK flip-flop 427 and an amplifier 428 consisting of NAND gates and inverters. The JK flip-flop 427 receives the output signal φa from the phase comparison section of FIG. 2. In response to the level of the signal φa, voltages at nodes 7a-9 and 7a-11 alternate high and low levels. The amplifier 428 receives and amplifies the outputs of the JK flip-flip 427 and the signals φb to φe.

The operation of the JK flip-flop 427 will be explained with reference to the timing chart of FIG. 5. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high and, then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 6:
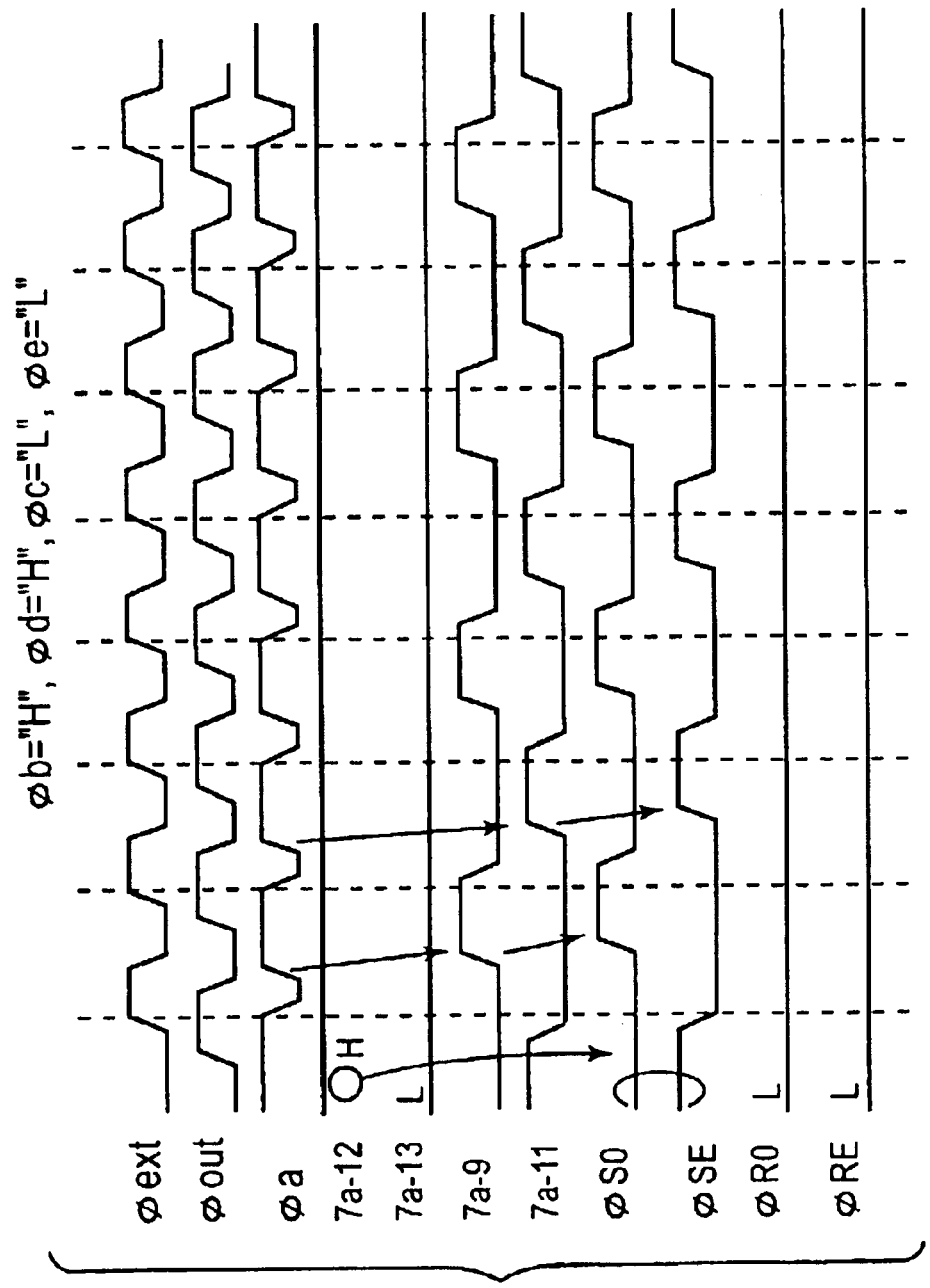
FIG. 6 is a timing chart showing an incremental operation of the amplification section of FIG. 4.
Figure 7:
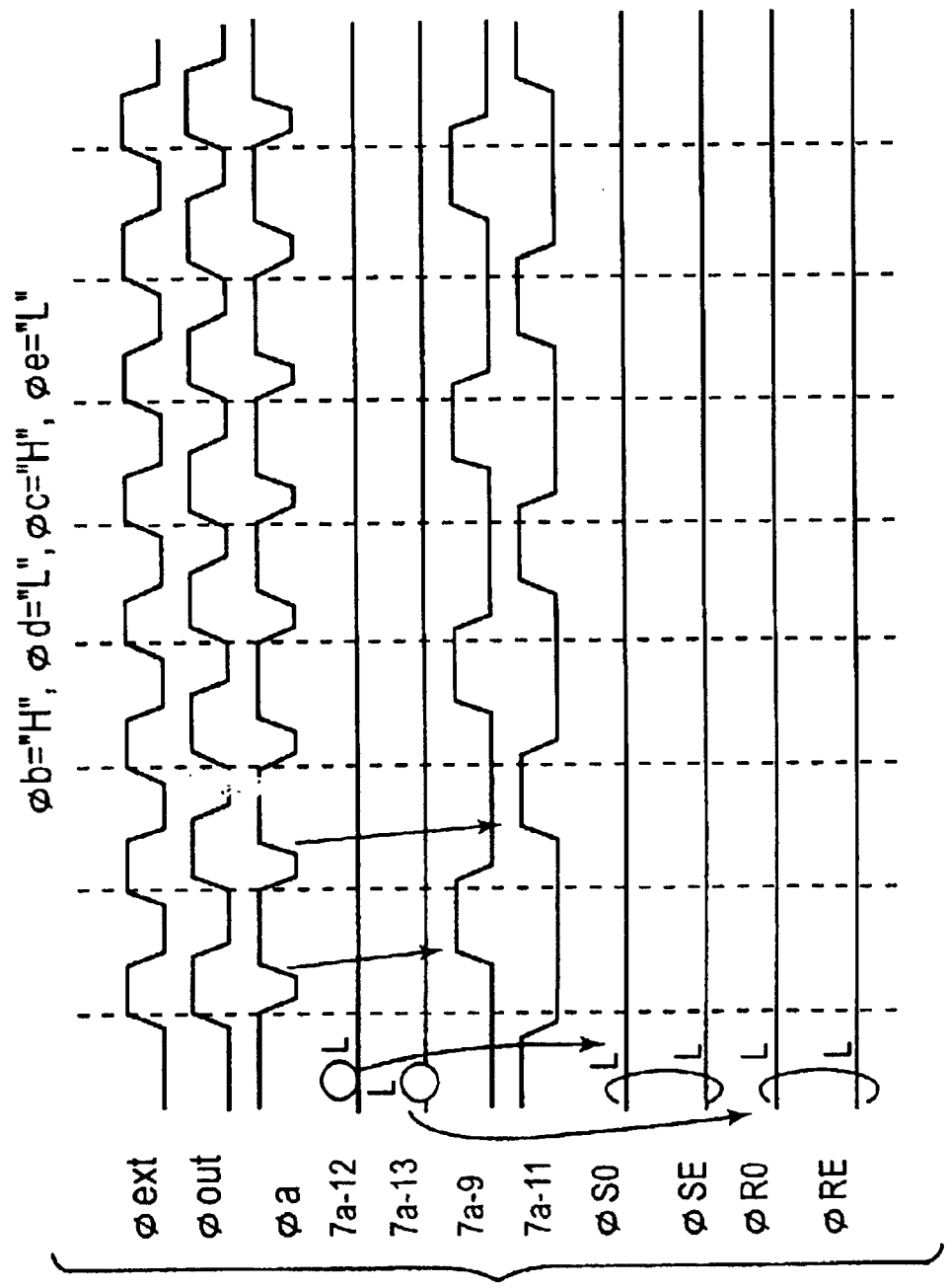
FIG. 7 is a timing chart showing a sustain operation of the amplification section of FIG. 4.
Figure 8:
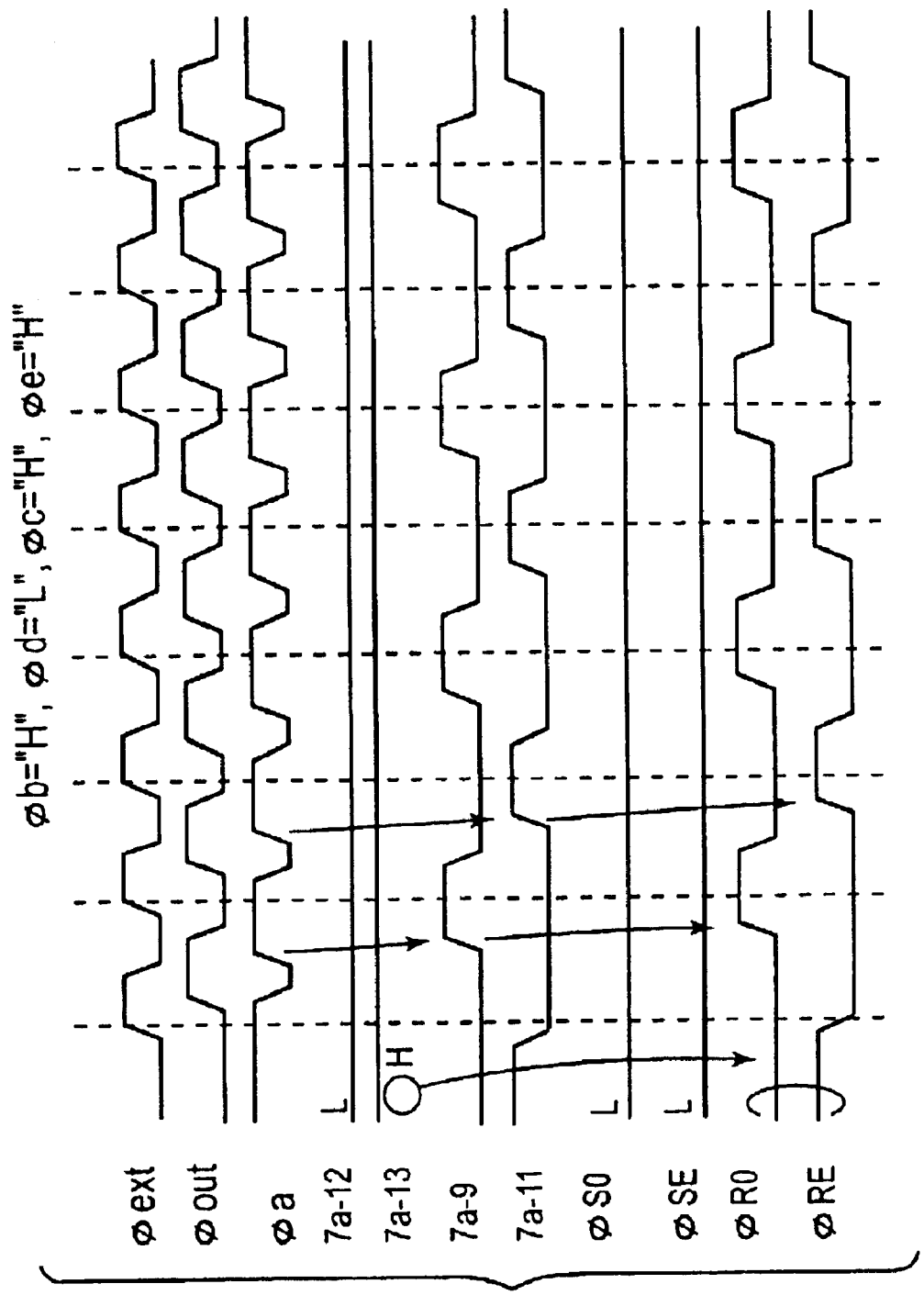
FIG. 8 is a timing chart showing a decremental operation of the amplification section of FIG. 4.

FIG. 6 is a timing chart showing an incremental operation of the amplification section of FIG. 4, FIG. 7 is a timing chart showing a sustain operation of the same, and FIG. 8 is a timing chart showing a decremental operation of the same.

In FIG. 6, the dummy internal clock signal φout changes from low to high before the same change in the reference signal φext. In this case, the phase comparison section of FIG. 2 provides the signal φb of high, φc of low, φd of high, and φe of low. As a result, a node 7a-12 becomes high, and a node 7a-13 is fixed at low. Although the incremental (set) signals φSO and φSE change in response to the state of the JK flip-flop 427, the decremental (reset) signals φRO and φRE are unchanged because the node 7a-13 is low.

In FIG. 7, the signal φout changes from low to high substantially simultaneously with the reference signal φext. In this case, the phase comparison section of FIG. 2 provides the signal φb of low, φc of high, φd of high, and φe of low. As a result, the nodes 7a-12 and 7a-13 are fixed at low. The set signals φSO and φSE are not influenced by the output of the JK flip-flop 427, and therefore, the signals φSO, φSE, φRO, and φRE are fixed at low.

In FIG. 8, the signal φout changes from low to high after the same change in the reference signal φext. In this case, the phase comparison section of FIG. 2 provides the signal φb of low, φc of high, φd of low, and φe of high. As a result, the node 7a-12 is fixed at low, the node 7a-13 is fixed at high, the reset signals φRO and φRE change in response to the state of the JK flip-flop 427, and the set signals φSO and φSE are unchanged because the node 7a-12 is low.

Figure 9:
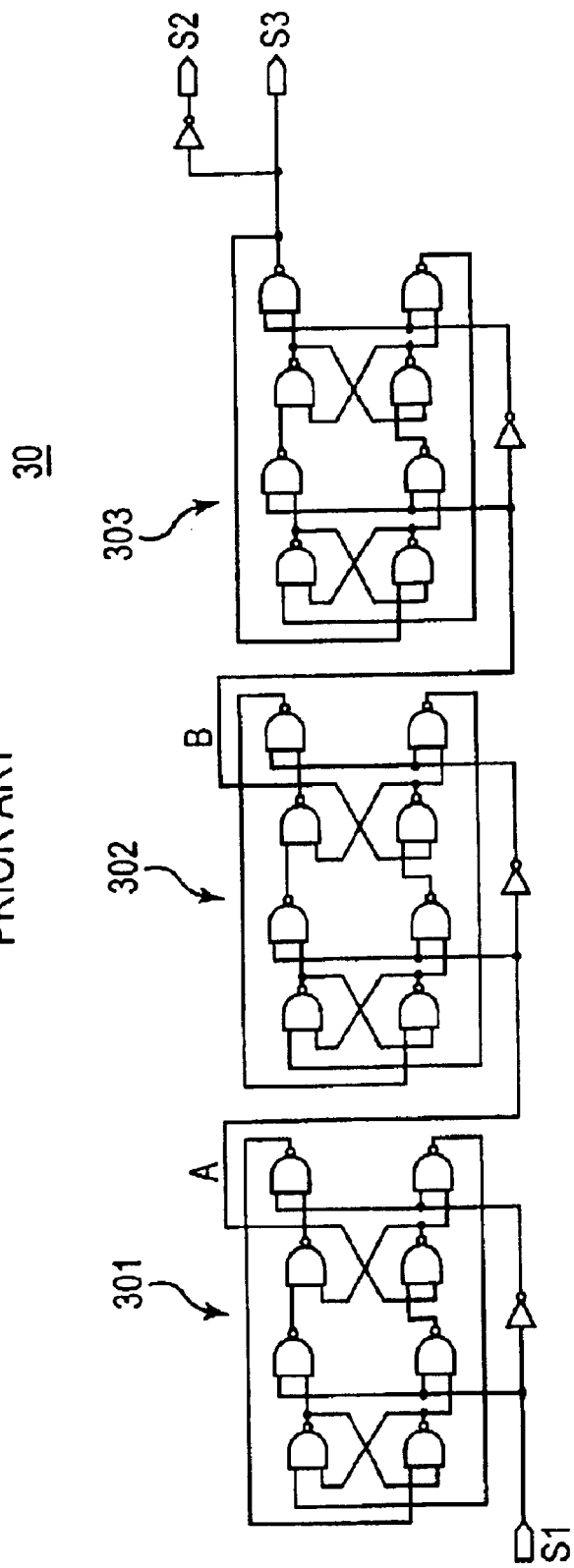
FIG. 9 shows a frequency divider of the semiconductor integrated circuit of FIG. 1.
Figure 10:
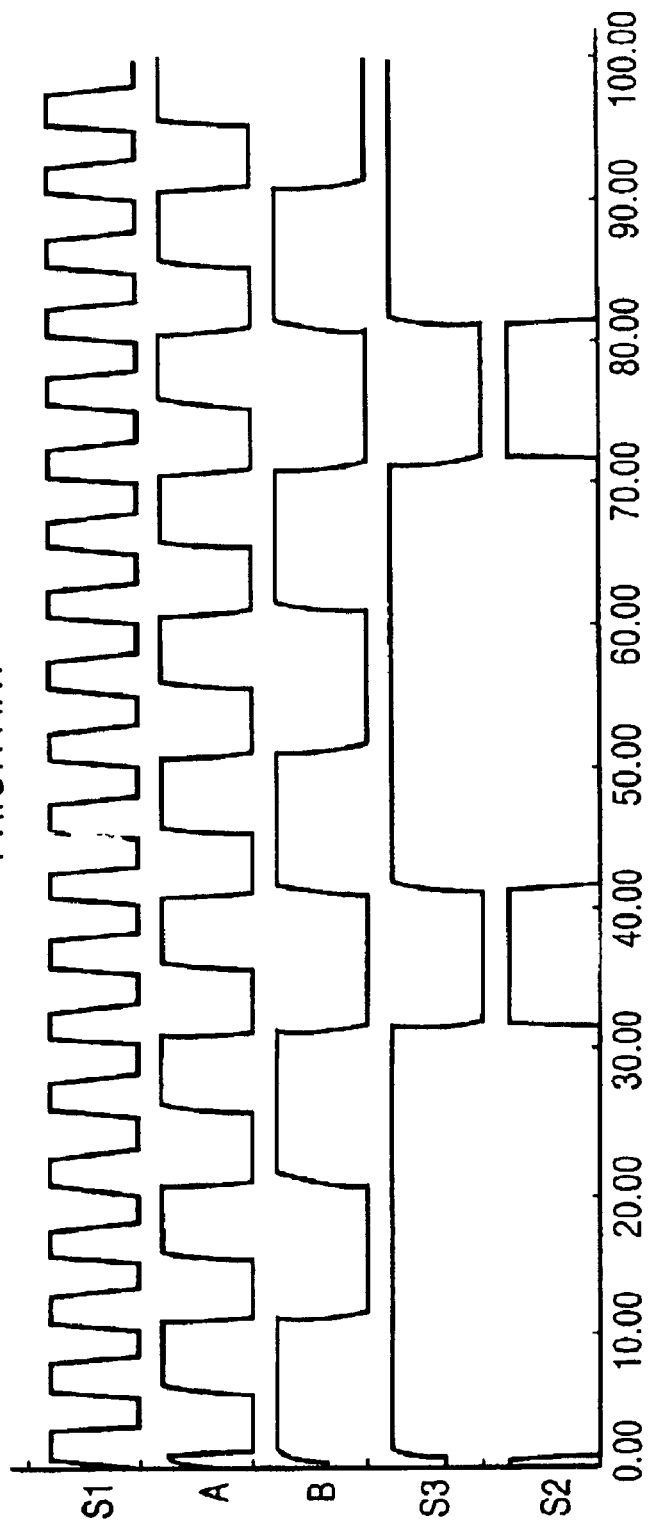
FIG. 10 shows the waveforms of signals at nodes of the frequency divider of FIG. 9.

FIG. 9 shows the frequency divider 30 of the related art of FIG. 1, and FIG. 10 shows the waveforms of signals at nodes of the frequency divider 30. The frequency divider 30 divides the frequency of the signal S1 (corresponding to the external clock signal CLK) by 8, to generate the signals S2 and S3 each having a high (or low) level duration corresponding to two clock periods of the signal S1 and a low (or high) level duration corresponding to six clock periods of the signal S1.

The frequency divider 30 consists of three counters 301 to 303 each made of NAND gates and an inverter, to receive the signal S1, i.e., the output of the input circuit 21 and provide the output signals S2 and S3. In FIG. 10, a reference mark A is the output of the first counter 301, and B is the output of the second counter 302. The arrangement of the frequency divider 30 is not limited to the one having the three counters. It may be realized with any combination of logic gates.

Figure 11:
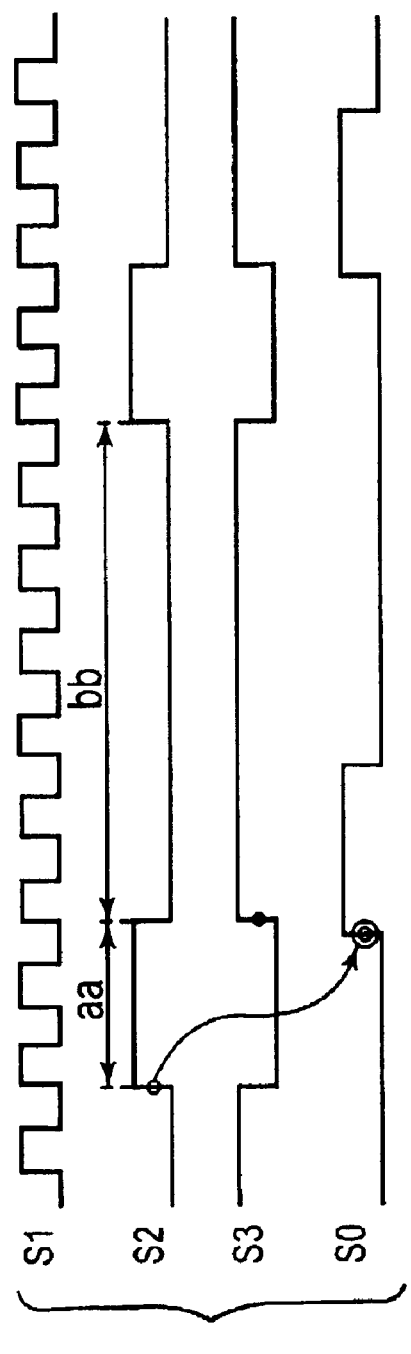
FIG. 11 is a timing chart showing the operation of the semiconductor integrated circuit having the frequency divider of FIG. 9.

FIG. 11 is a timing chart showing the operation of a semiconductor integrated circuit having the frequency divider 30 of FIG. 9.

The frequency divider 30 receives the signal S1 from the input circuit 21, divides the frequency thereof by 8, and provides the output signals S2 and S3. The signal S2 has a high-level duration aa corresponding to two periods of the signal S1 and a low-level duration bb corresponding to six periods of the signal S1. The phase of the signal S3 is opposite to that of the signal S2. The signal S2 is supplied to the dummy delay circuit 34, and the signal S3 is supplied to the phase comparison circuit 31. The signal S2 is passed through the dummy delay circuit 34, dummy clock line 42, dummy output circuit 52, and dummy input circuit 22, and then, supplied as the signal S0 to the phase comparison circuit 31.

The phase comparison circuit 31 compares the timing of a rise of the signal S3 with the timing of a rise of the signal S0 and controls the delay control circuit (shift register) 32 so that the delay control circuit 32 may provide the delay circuit 33 and dummy delay circuit 34 with the same delay. Consequently, the internal clock signal provided by the DLL circuit 3 is delayed behind the signal S1 (corresponding to the external clock signal CLK) of the input circuit 21 by the delay provided by the delay circuit 33. In this way, the DLL circuit 3 generates the internal clock signal whose phase is synchronized with a second preceding pulse of the external clock signal CLK. This DLL circuit 3 is applicable to high-speed SDRAMs.

The duration aa of the signal S2 may be changed so that the DLL circuit 3 generates the internal clock signal according to a preceding pulse of the external clock signal CLK. The duration aa of the signal S2 may be extended for three clock periods of the external clock signal CLK so that the DLL circuit 3 generates the internal clock signal according to a third preceding pulse of the signal CLK. The duration bb (aa+bb) of the signal S2 may be changed to change phase comparison intervals.

Figure 12B:
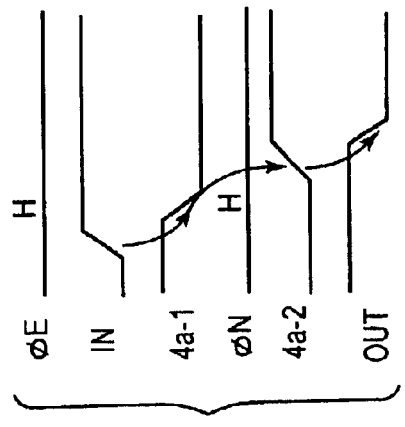
FIGS. 12A, 12B, and 12C show a delay circuit of the semiconductor integrated circuit of FIG. 1.
Figure 12A:
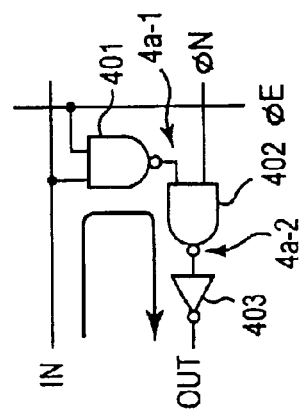
Figure 12C:
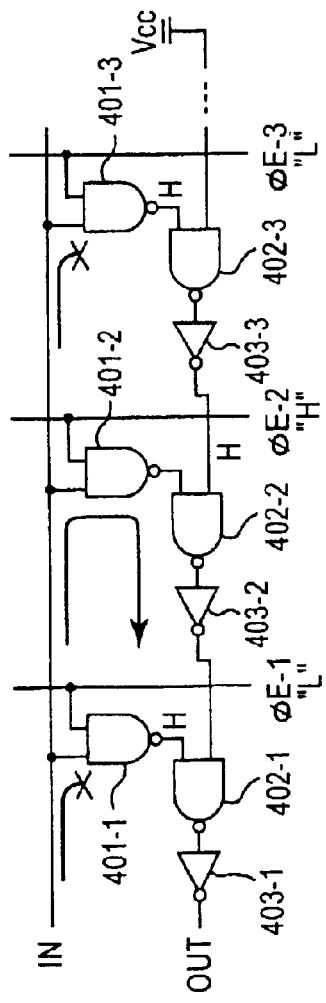

FIG. 12A shows the structure of a one-bit delay element contained in the delay circuits 33 and 34 of FIG. 1, FIG. 12B is a timing chart showing the operation of the one-bit delay element, and FIG. 12C shows cascaded one-bit delay elements.

The one-bit delay element has two NAND gates 401 and 402 and an inverter 403. An enable signal φE is high in FIG. 12B to activate the one-bit delay element. The one-bit delay element receives an input signal IN and a signal φN, which is an output signal of a right one-bit delay element, and provides an output signal OUT. Nodes 4a-1 and 4a-2 provide the waveforms shown in FIG. 12B. The output signal OUT is a signal φN to a left one-bit delay element.

When the signal φN is low, the output signal OUT is always low. If the signal φN is high and the signal φE is low, the output signal OUT is high. If the signal φN is high with the signal φE being high and the input signal IN being low, the output signal OUT is high, and with the input signal IN being high, the output signal OUT is low.

If the input signal IN rises with the enable signal φE being high, the input signal IN is passed through a path indicated with an arrow mark. If the enable signal φE is low, the input signal IN is blocked from the path.

In FIG. 12C, the one-bit delay elements are cascaded to form the delay circuit (33, 34). Although FIG. 12C shows only three one-bit delay elements, many elements are cascaded in practice, and each element is provided with a signal line such as φE-1, φE-2, or φE-3 each for transmitting an enable signal φE. These enable signals are controlled by the delay control circuit 32.

In FIG. 12C, the enable signal φE-2 is high to activate the center one-bit delay element. If the input signal IN changes from low to high, the NAND gates 401-1 and 401-3 of the left and right one-bit delay elements block the input signal IN because their enable signals φE-1 and φE-3 are each low.

On the other hand, the NAND gate 401-2 of the center one-bit delay element passes the input signal IN because its enable signal φE-2 is high. The NAND gate 402-2 thereof also passes the input signal IN because the output signal OUT (φN) of the right one-bit delay element is high. Then, the center one-bit delay element provides the output signal OUT of low. If the output signal OUT (φN) of the right one-bit delay element is low, the output signal OUT of the one-bit delay element that receives the output signal is always low. Accordingly, the output signal OUT of the center one-bit delay element is transmitted through the NAND gate and inverter of the left one-bit delay element and is provided as a final output signal.

In this way, the input signal IN is transmitted through an activated one-bit delay element as a final output signal. Namely, controlling the enable signal φE of a required one-bit delay element to high will control a delay in the delay circuit. The delay of a one-bit delay element is determined by the total signal propagation time of the NAND gates and inverter of the element and forms a unit delay time. A total delay time is calculated by multiplying the number of one-bit delay elements passed by the input signal IN by the unit delay time.

Figure 13:
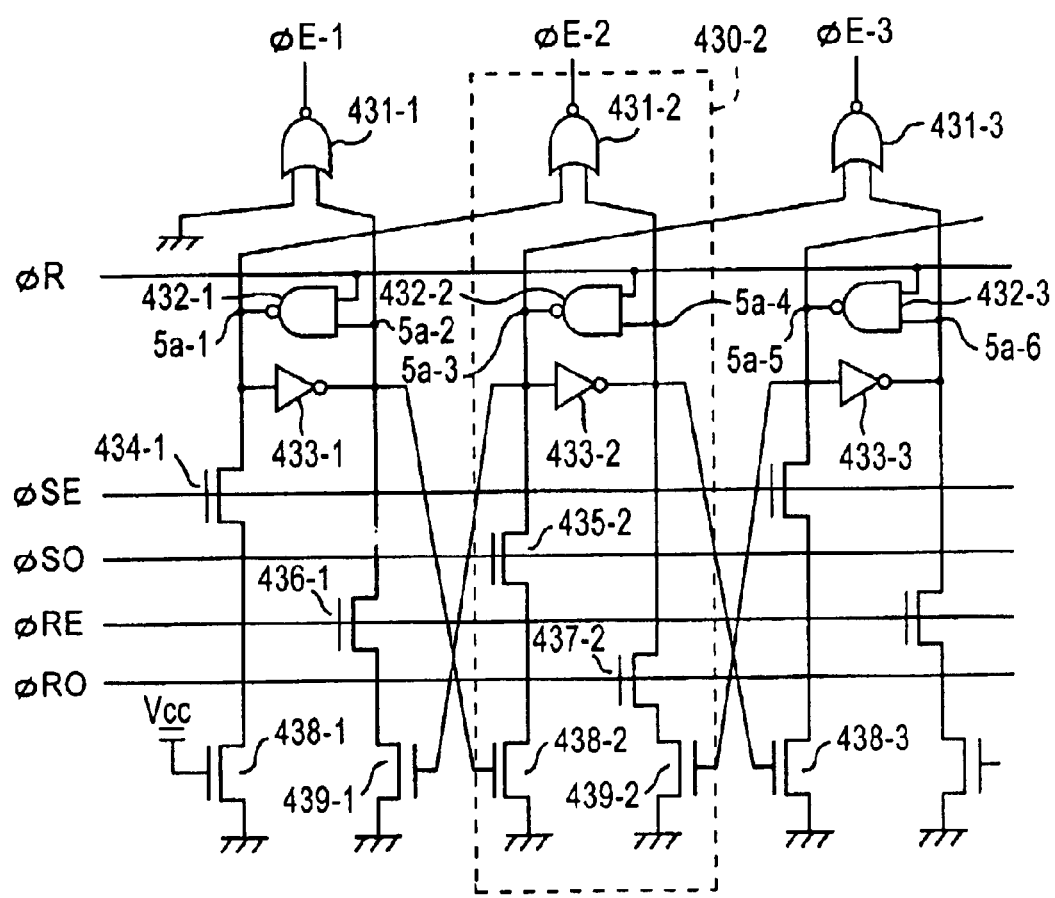
FIG. 13 shows a delay control circuit of the semiconductor integrated circuit of FIG. 1.

FIG. 13 shows the delay control circuit 32 of the related art of FIG. 1.

The delay control circuit 32 consists of one-bit control elements among which the one surrounded with a dotted line in FIG. 13 is a one-bit control element 430-2. Each element provides an enable signal φE to a corresponding one of the one-bit delay elements (FIG. 12C).

The one-bit control element 430-2 consists of a flip-flop having a NAND gate 432-2 and an inverter 433-2, transistors 435-2, 437-2, 438-2, and 439-2, and a NOR gate 431-2. The gate of the transistor 438-2 is connected to a node 5a-2 of a front one-bit control element. The gate of the transistor 439-2 is connected to a node 5a-5 of a rear one-bit control element. Incremental signals, i.e., set signals φSE and φSO and decremental signals, i.e., reset signals φRE and φRO are connected alternately to the one-bit control elements.

In the center one-bit control element 430-2, the gate of the transistor 435-2 receives the set signal φSO, and the gate of the transistor 437-2 receives the reset signal φRO. The gates of the corresponding transistors of the front and rear one-bit control elements receive the set signal φSE and reset signal φRE. The NOR gate 431-2 receives a signal from a node 5a-1 of the front element and a signal from a node 5a-4 of its own. A signal φR resets the delay control circuit 32. The signal φR is once set to low when a power source is turned on and is fixed to high thereafter.

Figure 14:
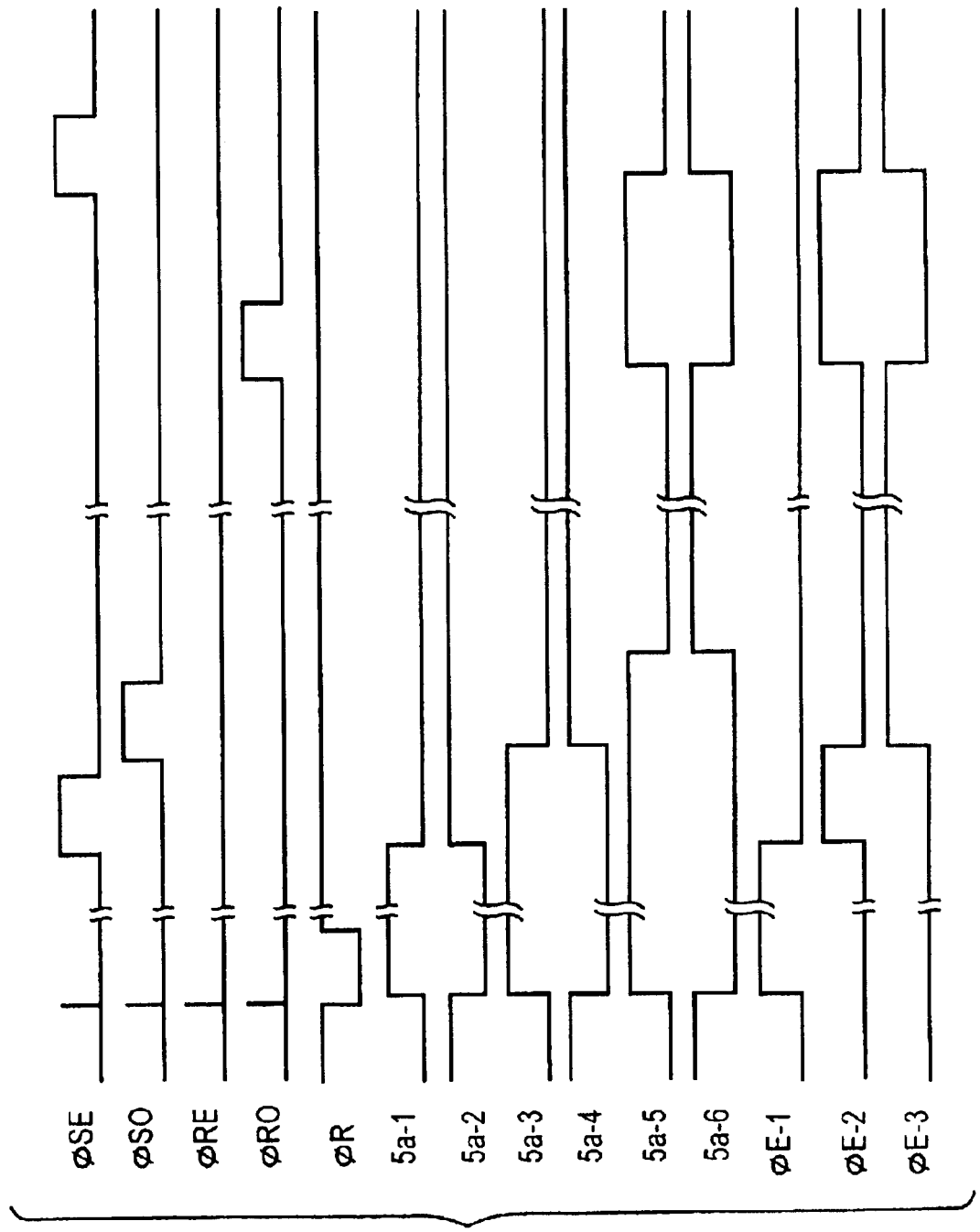
FIG. 14 is a timing chart showing the operation of the delay control circuit of FIG. 13.

FIG. 14 is a timing chart showing the operation of the delay control circuit 32.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φSO are set to high and low alternately.

When the set signal φSE is changed from low to high, the node 5a-1 is grounded to low, and the node 5a-2 is changed to high. Accordingly, the enable signal φE-1 changes from high to low. This state is latched by the flip-flop, and therefore, the enable signal φE-1 keeps the low level even if the set signal φSE returns to low. When the node 5a-1 changes to low, the enable signal φE-2 changes from low to high. When the node 5a-2 changes to high, the transistor 438-2 is turned on. When the set signal φSO changes from low to high, the node 5a-3 is grounded to low, and the node 5a-4 changes to high. As a result, the enable signal φE-2 changes from high to low. This state is latched by the flip-flop, and therefore, the enable signal φE-2 keeps the low level even if the set signal φSO returns to low.

When the node 5a-3 changes to low, the enable signal φE-3 changes from low to high. Although FIG. 14 shows each one pulse of the set signals φSE and φSO, many one-bit control elements are connected to one another in practice. Accordingly, if the set signals φSE and φSO are alternately set to high and low, the one-bit control element that provides the enable signal φE of high level will shift to the right sequentially. If the comparison result from the phase comparison circuit 31 indicates that a delay must be increased, the set signals φSE and φSO are alternately set to high and low.

When the incremental (set) signals φSE and φSO and decremental (reset) signals φRE and φRO are kept low, a fixed one-bit control element provides an enable signal φE of high level. Accordingly, if the comparison result from the phase comparison circuit 31 indicates to maintain a delay, the signals (φE, φSO, φRE, and φRO are kept at low level.

When carrying out a decremental operation, the reset signals φRE and φRO are alternately provided so that the one-bit control element that provides the enable signal φE of high level may shift to the left sequentially.

In this way, the delay control circuit 32 of FIG. 13 shifts the one-bit control element that provides an enable signal φE of high level element by element, to control the one-bit delay elements of FIG. 12C element by element.

Figure 15:
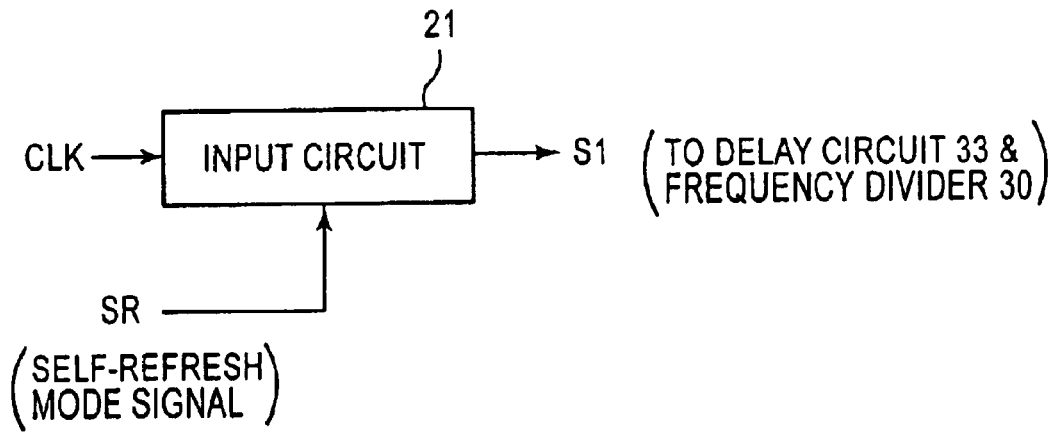
FIG. 15 schematically shows an input circuit of the semiconductor integrated circuit of FIG. 1.
Figure 16:
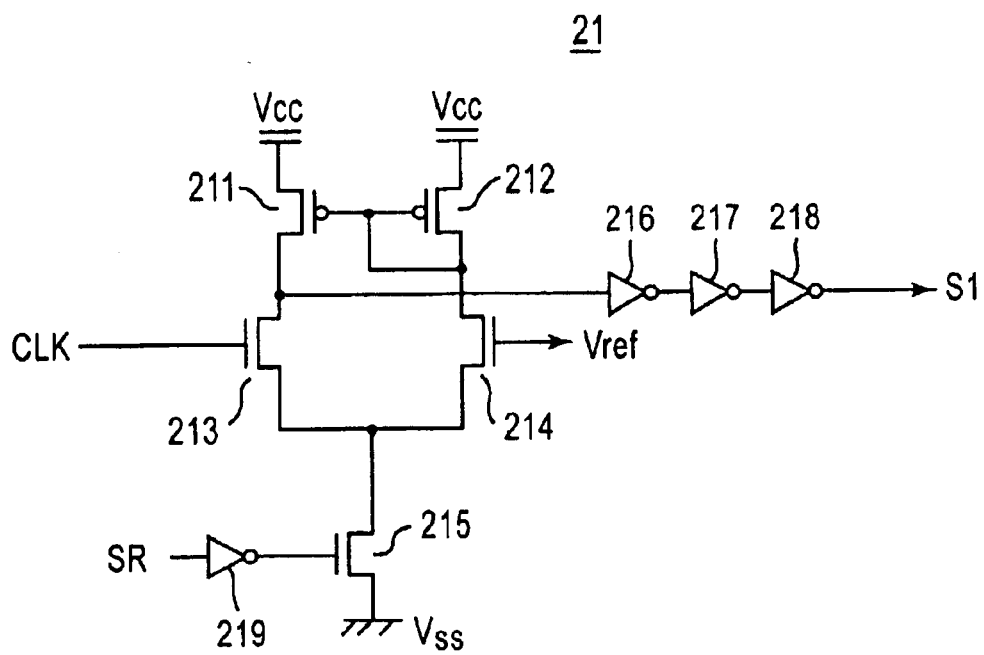
FIG. 16 shows an example of the input circuit of FIG. 15.

FIG. 15 schematically shows the input circuit 21 of the related art of FIG. 1, and FIG. 16 shows an example arrangement of the input circuit 21.

If the semiconductor integrated circuit of FIG. 1 is a synchronous DRAM, the input circuit 21 is stopped in response to a self-refresh mode signal SR to reduce power consumption during a self-refresh mode.

The input circuit 21 consists of a differential amplifier and inverters 216 to 219. The differential amplifier consists of p-channel transistors 211 and 212 and n-channel transistors 213, 214, and 215. The inverter 219 inverts the self-refresh mode signal SR and supplies the inverted signal to the gate of the transistor 215.

The self-refresh mode signal SR becomes high to establish a self-refresh mode. The inverter 219 inverts the signal SR and supplies the inverted signal to the gate of the transistor 215. As a result, the transistor 215 is turned off during the self-refresh mode, to stop and deactivate the differential amplifier. The external clock signal CLK is a small-amplitude signal such as an SSTL (series stub terminated logic) signal, and therefore, the differential amplifier amplifies a difference between the signal CLK and a reference voltage Vref, and the amplified signal drives the inverters 216 to 218. During the self-refresh mode, the signal CLK is stopped, and internal clock pulses generated by an internal oscillator are used to refresh memory cells.

In this way, the input circuit 21 of the related art applicable to synchronous DRAMs is deactivated in response to the self-refresh mode signal SR of high level, to thereby reduce the current consumption (power consumption) of the input circuit 21 during the self-refresh mode.

Circumferential conditions may change before and after the self-refresh mode. For example, a power source voltage and ambient temperature may greatly change before and after the self-refresh mode. In this case, the DLL circuit 3 that receives the output of the input circuit 21 needs many dummy cycles to restore a lock-on (steady) state. This wastes time. As explained with reference to FIGS. 1 to 14, the DLL circuit 3 must synchronize the phase of the output of the output circuit 51 with the phase of the external clock signal CLK. To achieve this, the DLL circuit 3 must control the amount of delay by sequentially shifting the delay elements of the delay circuit 33. This is the reason why the DLL circuit 3 needs a long lock-on time after the completion of the self-refresh mode.

Next, an input circuit according to the present invention and a semiconductor integrated circuit employing the input circuit will be explained with reference to the accompanying drawings.

Figure 17:
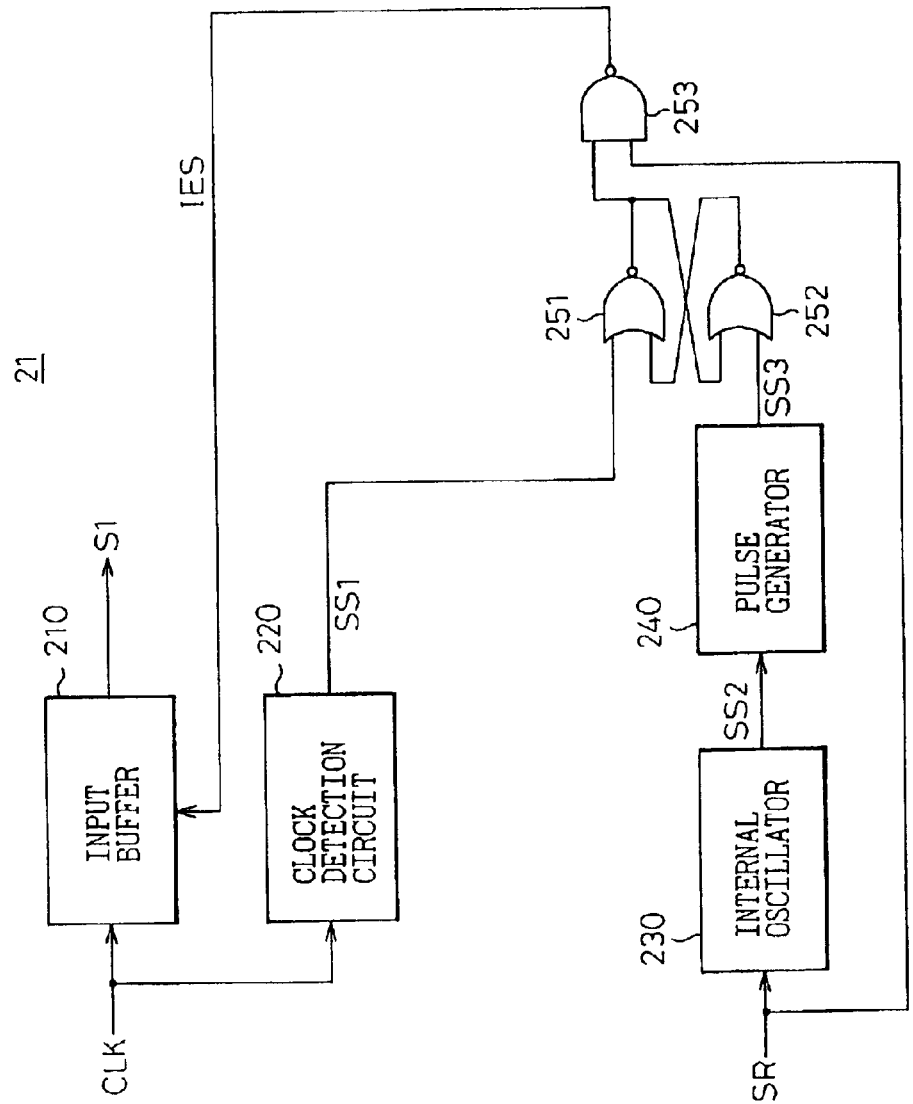
FIG. 17 shows an input circuit according to an embodiment of the present invention.

FIG. 17 shows the input circuit according to the present invention. This input circuit replaces the input circuit 21 of FIG. 1. The input circuit 21 of FIG. 17 has an input buffer 210, a clock detection circuit 220, an internal oscillator 230, and a pulse generator 240. When the input circuit is applied to a DRAM (SDRAM), a self-refresh oscillator of the DRAM may be used as the internal oscillator 230.

The input circuit 21 further has logic circuits 251 to 253, which carry out logical operations on an output signal SS1 of the clock detection circuit 220, a self-refresh mode signal SR, and an output signal SS3 of the pulse generator 240 and provides an input buffer enable signal IES. These logic circuits are NOR gates 251 and 252 and a NAND gate 253.

Figure 18:
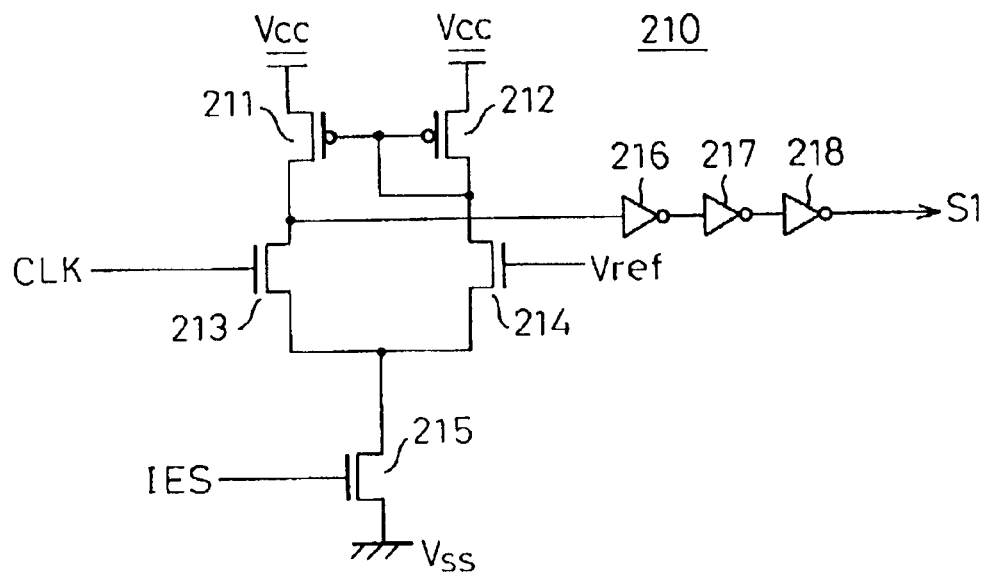
FIG. 18 shows an input buffer of the input circuit of FIG. 17.

FIG. 18 shows an example of the input buffer 210 of FIG. 17 and corresponds to the input circuit of the related art of FIG. 16. Unlike the input circuit of FIG. 16 that supplies the self-refresh mode signal SR to the gate of the transistor 215, the input buffer 210 of FIG. 18 supplies the input buffer enable signal IES to the gate of a transistor 215. The signal IES is the output of the NAND gate 253.

The input buffer 210 has p-channel transistors 211 and 212, n-channel transistors 213 to 215, and inverters 216 to 218. The gate of the transistor 213 receives the external clock signal CLK and the gate of the transistor 214 receives a reference voltage Vref, to compare CLK and Vref with each other. A difference between CLK and Vref is amplified and passed through the inverters 216 and 218. The reason why the input buffer 210 has the differential amplifier in the first stage thereof is because the external clock signal CLK is a small-amplitude signal such as an SSTL signal that is difficult for the inverters 216 to 218 to directly amplify.

The input buffer 210 becomes active in response to the input buffer enable signal IES of high level and supplies a signal S1 corresponding to the external clock signal CLK to the delay circuit 33 and frequency divider 30 of FIG. 1. If the signal IES is low, the input buffer 210 becomes inactive (stopped) to decrease power consumption.

Figure 19:
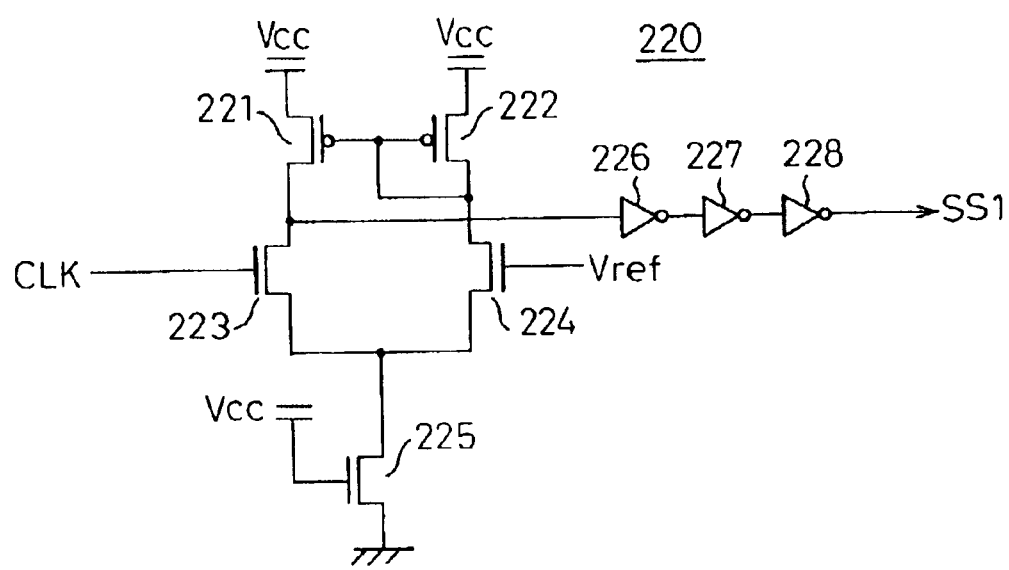
FIG. 19 shows a clock detection circuit of the input circuit of FIG. 17.

FIG. 19 shows an example of the clock detection circuit 220 of FIG. 17.

As is apparent from comparison between FIGS. 18 and 19, the clock detection circuit 220 is basically the same as the input buffer 210. Namely, it has a differential amplifier and three inverters 226 to 228 for inverting the output of the differential amplifier. The differential amplifier consists of transistors 221 to 225 for comparing the level of the external clock signal CLK, which is a small-amplitude signal such as an SSTL signal, with the level of the reference voltage Vref. Unlike the input buffer 210, the clock detection circuit 220 needs only small driving capacity (current), and therefore, the transistors thereof are small. The gate of the transistor 225 receives, for example, a high source voltage Vcc to make the differential amplifier of the circuit 220 always active.

Figure 20:
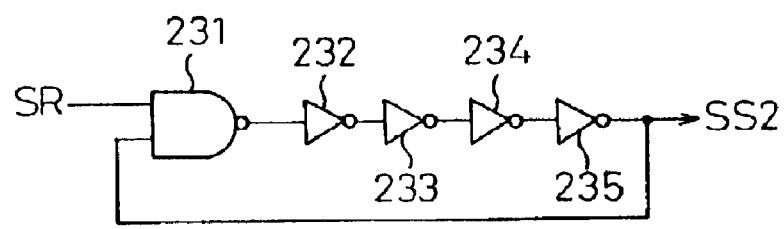
FIG. 20 shows an internal oscillator of the input circuit of FIG. 17.

FIG. 20 shows an example of the internal oscillator 230 of FIG. 17.

The internal oscillator 230 is a ring oscillator consisting of a NAND gate 231 for receiving the self-refresh mode signal SR and four inverters 232 to 235. When the signal SR is high, the oscillator 230 generates pulses.

Figure 21:
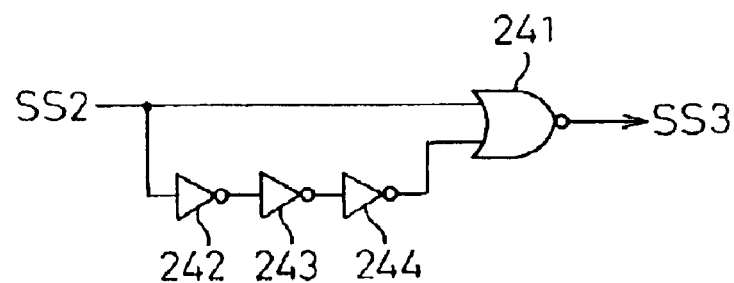
FIG. 21 shows a pulse generator of the input circuit of FIG. 17.

FIG. 21 shows an example of the pulse generator 240 of FIG. 17.

The pulse generator 240 consists of a NOR gate 241 and three inverters 242 to 244, to receive an output signal SS2 of the internal oscillator 230 and provide a signal SS3 having a predetermined pulse width. The pulse width of the signal SS3 corresponds to a delay time determined by the inverters 242 to 244.

Although the input circuit 21 of FIG. 17 consists of the input buffer 210, clock detection circuit 220, internal oscillator 230, pulse generator 240, and logic circuit having the NOR gates 251 and 252 and NAND gate 253, it may have any other structure.

Figure 22:
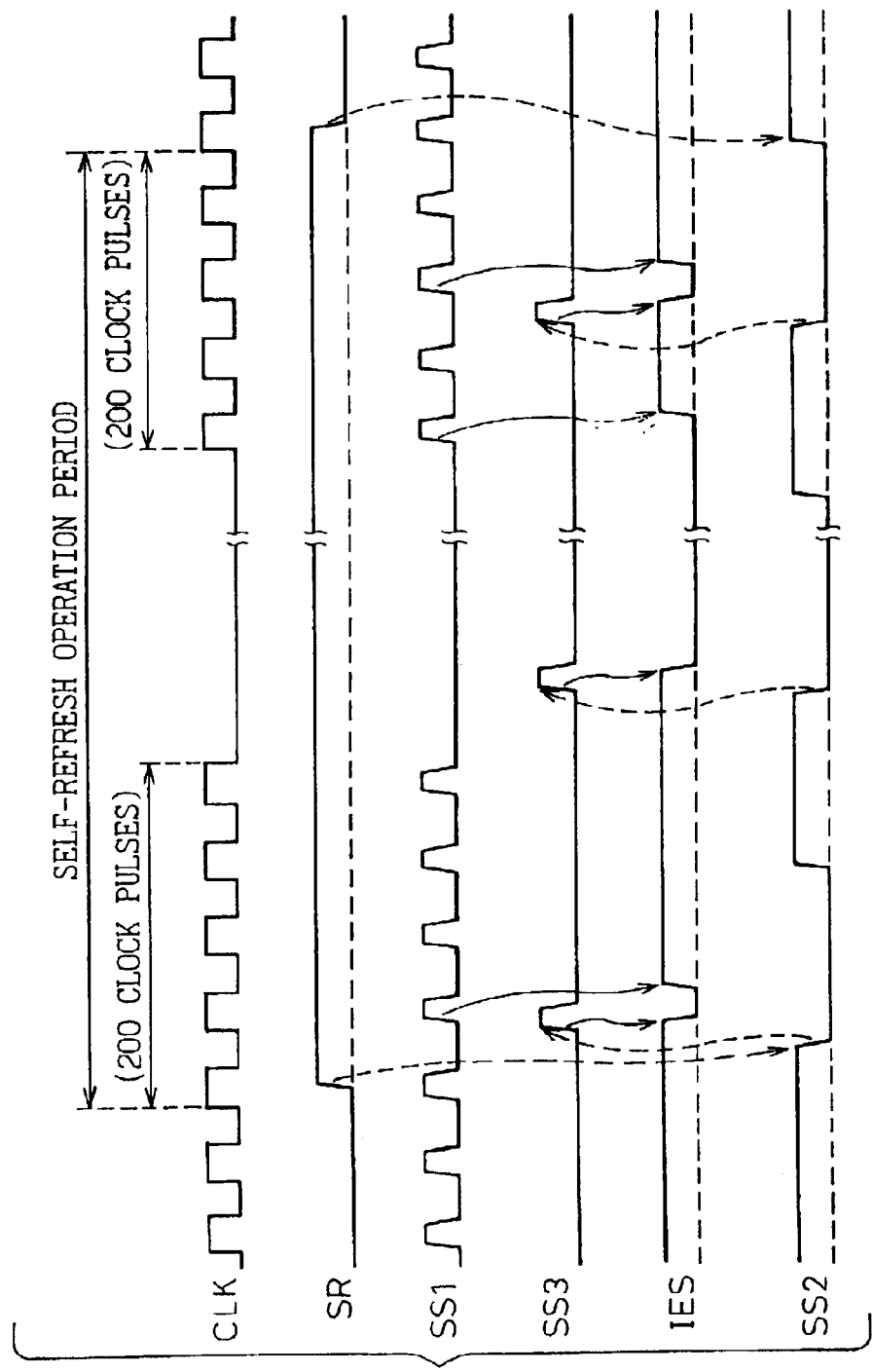
FIG. 22 is a timing chart showing the operation of the input circuit of FIG. 17.

FIG. 22 is a timing chart showing the operation of the input circuit 21 of FIG. 17. The external clock signal CLK is not suddenly stopped in response to the self-refresh mode signal SR. For example, the signal CLK continues for 200 pulses after the signal SR becomes high to start the self-refresh mode, and then stops. Thereafter, the signal CLK restarts, for example, 200 pulses earlier than the signal SR drops to low to terminate the self-refresh mode.

In FIGS. 17 to 22, the self-refresh mode signal SR changes from low to high, and the internal oscillator 230 starts to generate the signal SS2. The signal SS2 is supplied to the pulse generator 240, which provides the signal SS3 whose pulse width corresponds to a delay time determined by the inverters 242 to 244. The signal SS3 is supplied to an input terminal of the NOR gate 252.

The clock detection circuit 220 detects the external clock signal CLK and provides the signal SS1. The signal SS1 is supplied to an input terminal of the NOR gate 251. The other input terminal of the NOR gate 251 receives the output of the NOR gate 252, and the other input terminal of the NOR gate 252 receives the output of the NOR gate 251. Namely, the NOR gates 251 and 252 form a latch circuit that holds data in response to the levels of the signals SS1 and SS3.

The output of the NOR gate 251 and self-refresh mode signal SR are supplied to input terminals of the NAND gate 253. The NAND gate 253 generates the input buffer enable signal IES that changes from high to low if the signal SR is high and the signal SS3 changes from low to high, and from low to high if the signal SR is high and the signal SS1 changes from low to high. The reason why the signal IES is changed from high to low in response to the output signal SS3 of the pulse generator 240 is to periodically check the output signal SS1 of the clock detection circuit 220.

The input buffer enable signal IES is raised to high when the external clock signal CLK is supplied to the clock detection circuit 220, to activate the input buffer 210. Then, the signal S1 is generated from the external clock signal CLK without regard to the level of the self-refresh mode signal SR and is supplied to the delay circuit 33 and frequency divider 30 of FIG. 1 to operate the DLL circuit 3.

In this way, the input circuit 21 of the present invention usually maintains the input buffer enable signal IES high to keep the input buffer 210 active. If the self-refresh mode signal SR is supplied to the internal oscillator 230, the output of the internal oscillator 230 alternates high and low levels at predetermined intervals until the signal SR falls to low, without regard to the period of the external clock signal CLK. If the signal SR falls to low, the output SS2 of the internal oscillator 230 stays high.

In response to a fall of the output signal SS2 of the internal oscillator 230, the output SS3 of the pulse generator 240 rises to high. In response to this, the input buffer enable signal IES changes from high to low to deactivate the input buffer 210. The input buffer 210 stays inactive because the signal IES is kept low until the clock detection circuit 220 provides the detected signal SS1.

When the external clock signal CLK is detected by the detection circuit 220, the input buffer enable signal IES changes from low to high to activate the input buffer 210.

In this way, the present invention activates the input buffer 210 in response to the external clock signal CLK, without regard to the self-refresh mode signal SR, and always deactivates the input buffer 210 if the external clock signal CLK is stopped.

Then, the DLL circuit 3 operates in response to the external clock signal CLK even during a self-refresh mode. Even if circumferential conditions change before and after the self-refresh mode, for example, even if source voltages and ambient temperature greatly change before and after the self-refresh mode, the present invention needs no dummy cycles for locking the DLL circuit, thereby wasting no time. The present invention deactivates the input buffer 210 while the external clock signal CLK is stopped, to reduce current consumption (power consumption). If the external clock signal CLK is stopped during the self-refresh mode, the internal oscillator 230 starts to operate at predetermined intervals so that the pulse generator 240 provides a signal to deactivate the input buffer 210, thereby reducing current consumption.

Figure 23:
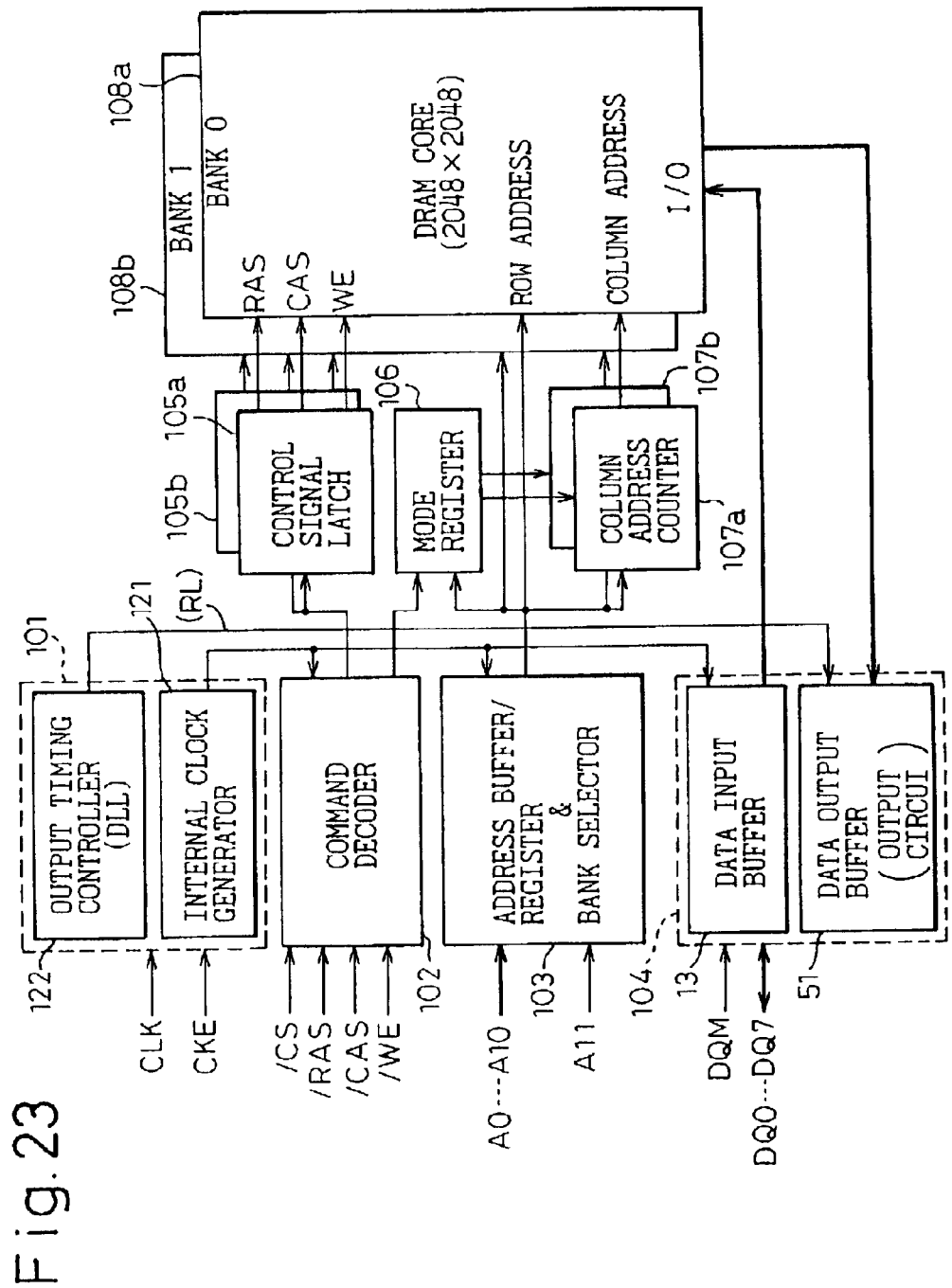
FIG. 23 shows a synchronous DRAM according to the present invention.
Figure 24:
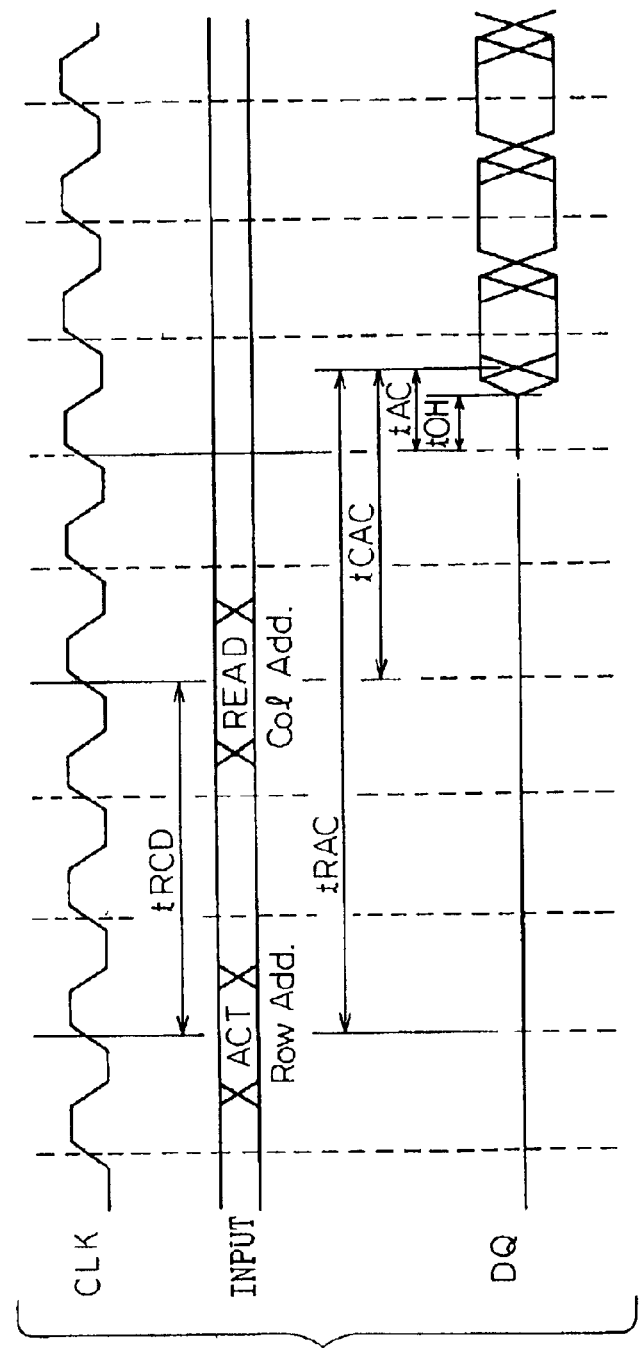
FIG. 24 is a timing chart showing the operation of the synchronous DRAM of FIG. 23.

FIG. 23 shows a synchronous DRAM (SDRAM) according to the present invention, and FIG. 24 is a timing chart showing the operation thereof.

The SDRAM employs a pipeline method and is a 2-bank, 8-bit, 16-M SDRAM.

The SDRAM has DRAM cores 108a and 108b, a clock buffer 101, a command decoder 102, an address buffer/register and bank address selector 103, an I/O data buffer/register 104, control signal latches 105a and 105b, a mode register 106, and column address counters 107a and 107b. Signals /CS, /RAS, /CAS, and /WE are combined to form a command that specifies an operation mode. The command is decoded by the command decoder 102 and, according to the mode specified by the command, circuits are controlled. The signals /CS, /RAS, /CAS, and /WE are also supplied to the latches 105a and 105b that maintain their states until the next command is provided.

Address signals are amplified by the address buffer 103, which provides row addresses for the banks as well as initial addresses for the column address counter 107a and 107b.

The clock buffer 101 has an internal clock generator 121 and an output timing controller 122. The internal clock generator 121 generates an ordinary internal clock signal according to an external clock signal CLK. The output timing controller 122 employs the DLL circuit mentioned above to generate a clock signal whose delay (or phase) is correctly controlled. The input circuit 21 of the present invention forms a part of the clock buffer 101 (internal clock generator 121).

The register 104 has a data input buffer 13 and a data output circuit 51. The data output circuit 51 amplifies data read out of the DRAM cores 108a and 108b and provides the data through output pads DQ0 to DQ7 according to the delay-locked clock signal provided by the output timing controller 122. Input data to the pads DQ0 to DQ7 are received by the data input buffer 13. A real line (RL) runs between the output timing controller 122 and the data output circuit 51.

FIG. 24 shows a read operation of the SDRAM of FIG. 23.

The external clock signal CLK is supplied from a system to the SDRAM. In synchronization with a rise of the signal CLK, the SDRAM reads commands, address signals, and input data and provides output data.

To read data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer 51, and transfers the data to the output terminal DQ. These operations are the same as those of a standard DRAM. In the SDRAM, circuits related to a column address carry out a pipeline operation, and read data is continuously provided. A data transfer speed is determined by the period of the signal CLK.

The SDRAM involves three kinds of access time each of which is defined according to a rise of the signal CLK. In FIG. 24, there are row address access time tRAC, column address access time tCAC, and clock signal access time tAC.

Figure 25:
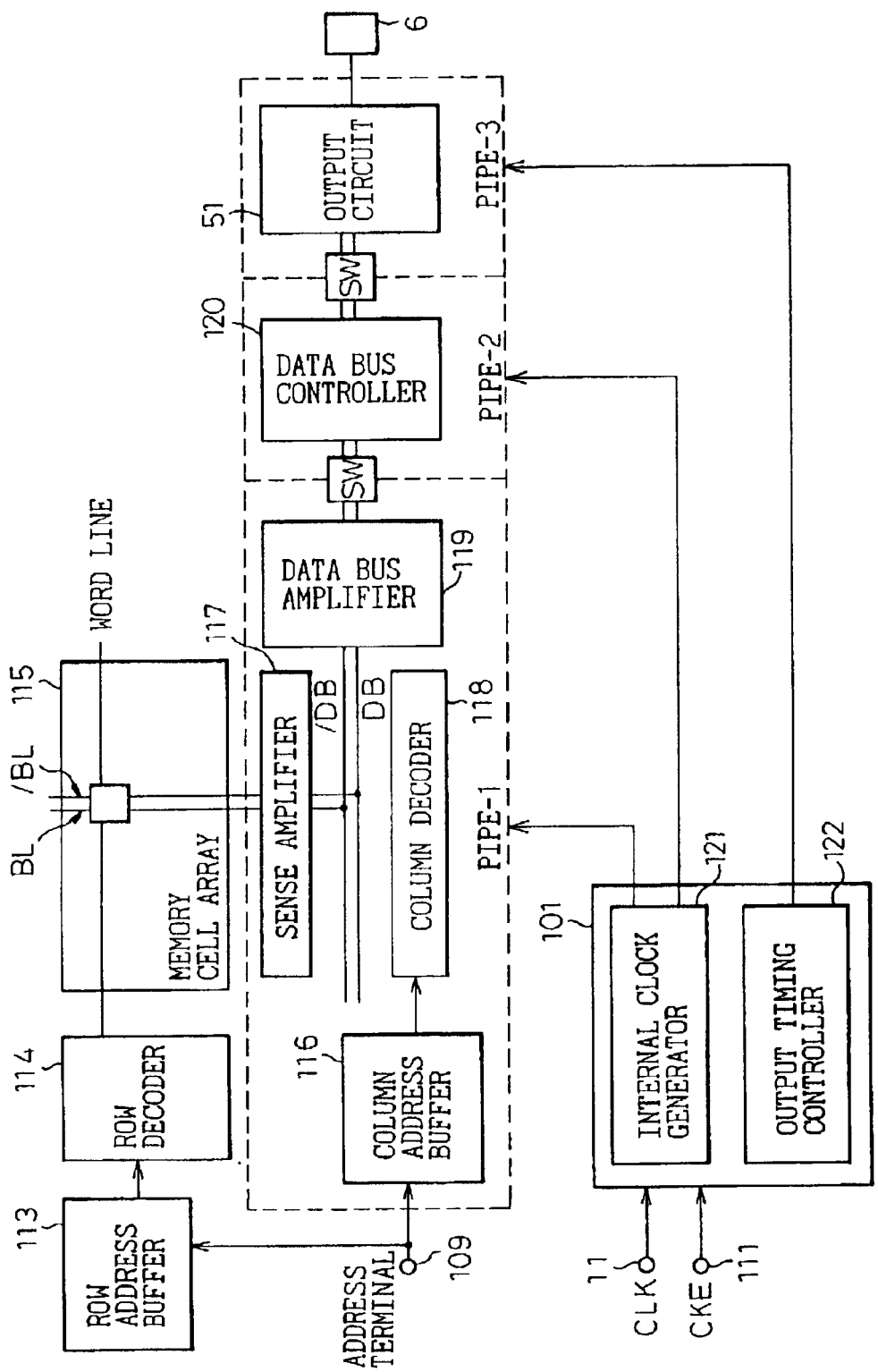
FIG. 25 shows an essential part of the synchronous DRAM of FIG. 23.

FIG. 25 is a block diagram showing essential parts of the SDRAM of FIG. 23 and explains a pipeline operation thereof with three pipes.

The circuit for processing a column address in the SDRAM is divided into several sections along a processing flow. Each of the divided sections is called a pipe.

As explained with reference to FIG. 23, the buffer 101 has the internal clock generator 121 and output timing controller 122. The internal clock generator 121 generates an ordinary internal clock signal, which is supplied to the pipes 1 and 2. The output timing controllers 122 provide a delay-locked (phase-locked) internal clock signal to the output circuit 51 (data output buffer) of the pipe 3. The input circuit 21 of the present invention forms a part of the internal clock generator 121, as explained above.

The supplied internal clock signals control the corresponding pipes. Between the pipes, there are switches for controlling the transmission timing of a signal. These switches are controlled according to the internal clock signal generated by the clock buffer 101 (internal clock generator 121).

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 51). The data input buffer 13 in the I/O buffer 104 is not shown in FIG. 25.

The circuit in each pipe completes its operation within a clock cycle, and the switches between the pipes are opened and closed in synchronization with the clock signal, to relay data. As a result, the pipes process data in parallel, and data is continuously sent to the output terminal in synchronization with the clock signal.

Figure 26:
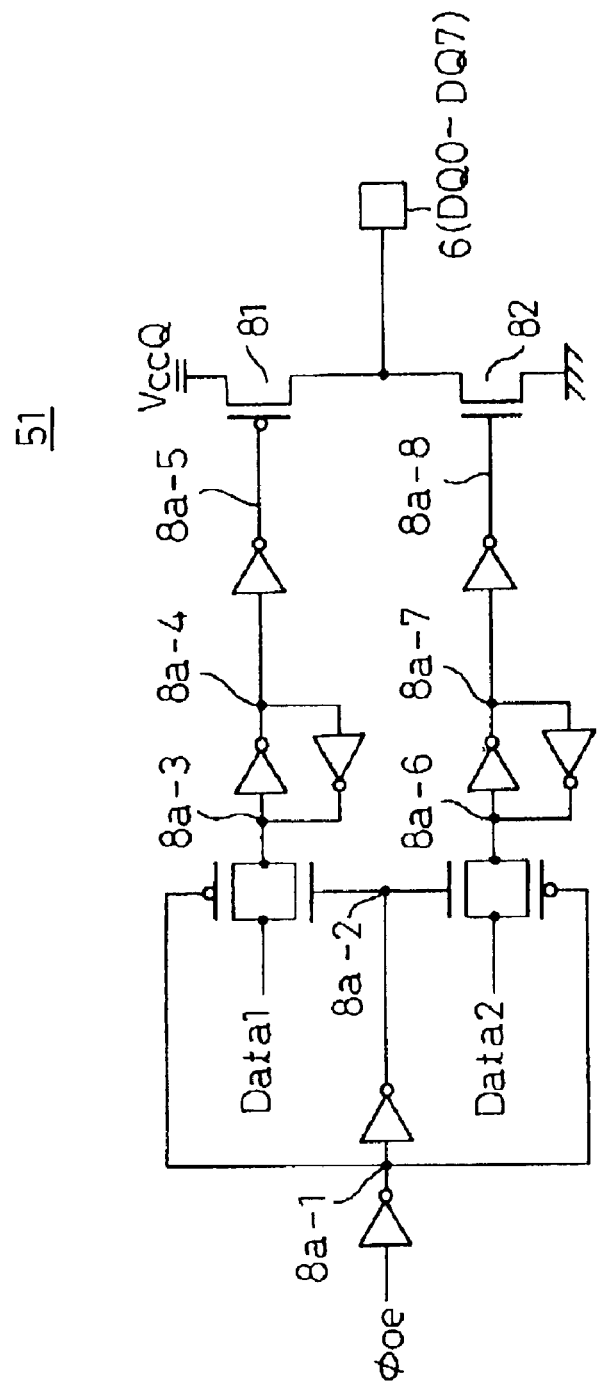
FIG. 26 shows an output circuit (a data output buffer) of the synchronous DRAM of FIG. 23.

FIG. 26 shows an example of the output circuit (data output buffer) 51 of the present invention (FIG. 25). In FIGS. 25 and 26, signals Data1 and Data2 correspond to data read out of a cell array 115 through the sense amplifier 117, data bus amplifier 119, and data bus controller 120 of FIG. 25. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (the delay circuit 33 of FIG. 1) and serves as an enable signal for the output circuit 51.

When the clock signal φoe becomes high, the signals Data1 and Data2 appear at the data output pad 6 (DQ0 to DQ7). When letting the output pad 6 provide a signal of high level, the signal foe changes from low to high, a node 8a-1 to low, and a node 8a-2 to high, to turn on transfer gates. Then, the signals Data1 and Data2 are transferred to nodes 8a-3 and 8a-6. As a result, a node 8a-5 changes to low and a node 8a-8 to high, to turn on a p-channel transistor 81 and off an n-channel transistor 82. Consequently, the data output pad 6 provides a signal of high level. When the signal φoe changes to low, the transfer gates are turned off to hold the present output state.

Figure 27:
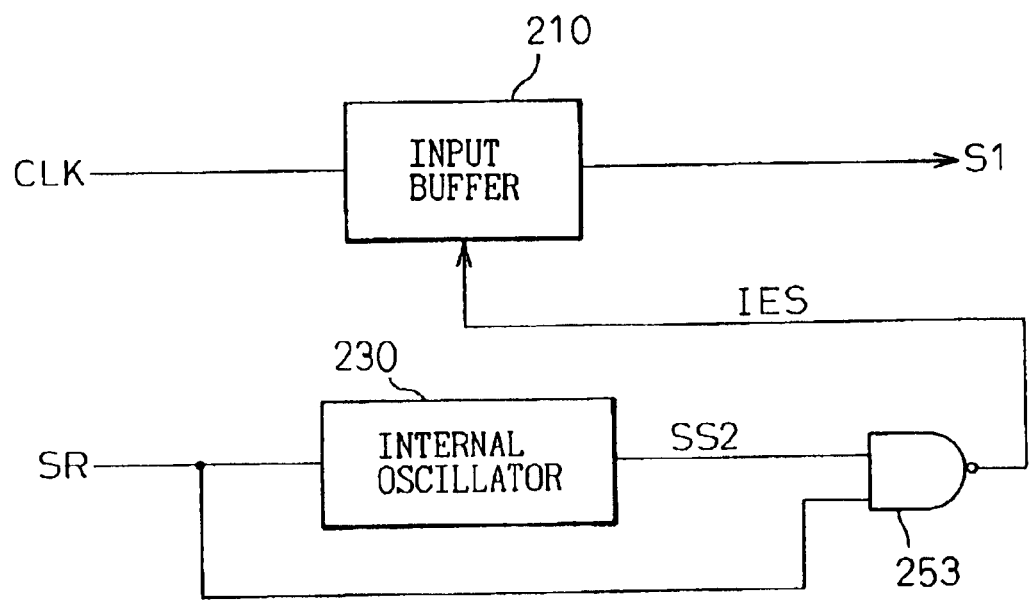
FIG. 27 shows an input circuit according to a second embodiment of the present invention.
Figure 28:
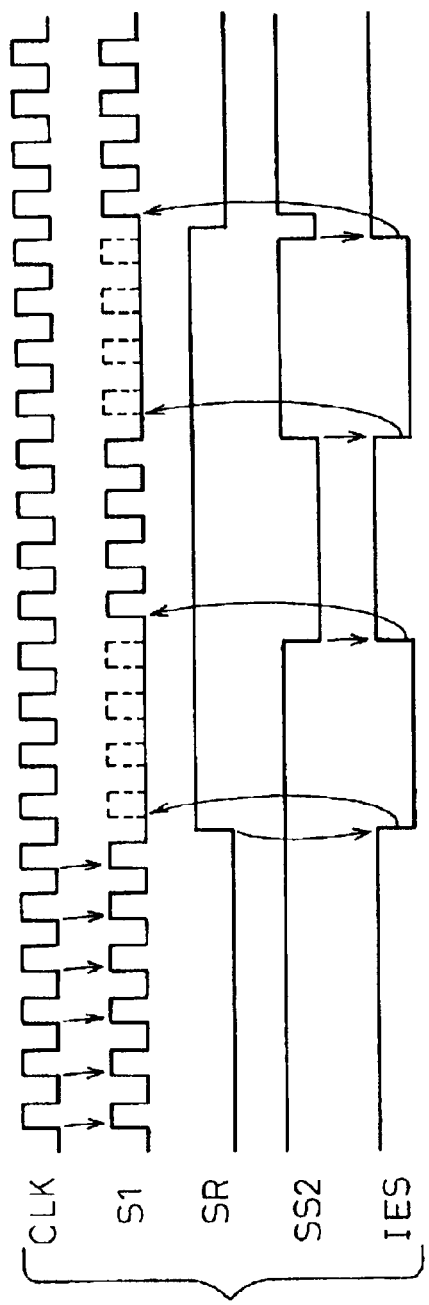
FIG. 28 is a timing chart showing the operation of the input circuit of FIG. 27.

FIG. 27 shows an input circuit according to the second embodiment of the present invention, and FIG. 28 is a timing chart showing the operation thereof. The input circuit has an input buffer 210, an internal oscillator 230, and a NAND gate 253.

Instead of detecting an external control signal (clock signal) CLK by the clock detection circuit 220 of the first embodiment of FIG. 17, the second embodiment issues an input buffer enable signal IES to control an internal control signal (internal clock signal) S1 provided by the input buffer 210.

A self-refresh mode signal SR and the output of the internal oscillator 230 are supplied to the NAND gate 253, which provides the input buffer enable signal IES to control the internal control signal S1 provided by the input buffer 210.

In FIG. 28, the self-refresh mode signal SR becomes high to start a self-refresh mode. During the self-refresh mode, the input buffer enable signal IES becomes high when the output signal SS2 of the internal oscillator 230 becomes low. This activates the input buffer 210 to issue the internal control signal S1.

The second embodiment needs no clock detection circuit 220 of the first embodiment and halves the active period of the input buffer 210 in response to the low-level period of the output signal SS2 of the internal oscillator 230. This results in reducing power consumption. The reason why the input buffer 210 is operated when the output signal SS2 of the internal oscillator 230 is low will be explained. Each self-refresh operation starts when the output signal SS2 rises and ends when the same falls. Namely, the number of circuits operating in a chip is minimum when the output signal SS2 is low. Accordingly, power sources in the chip are stable during the low-level period of the output signal SS2, and therefore, the period is optimum for carrying out DLL phase adjustment.

When the input circuit is applied to a DRAM (SDRAM), a self-refresh oscillator of the DRAM may be used as the internal oscillator 230. The self-refresh mode signal SR may be another signal. The input circuit is applicable not only to DRAMs but also to other devices. When the input circuit is applied to semiconductor integrated circuits such as SRAMs (static random access memories) and flash EEPROMs (electrically erasable programmable read only memories) that have no internal oscillators, the input circuit must be provided with the internal oscillator 230 to reduce, for example, the lock-on time of a DLL circuit.

Figure 29:
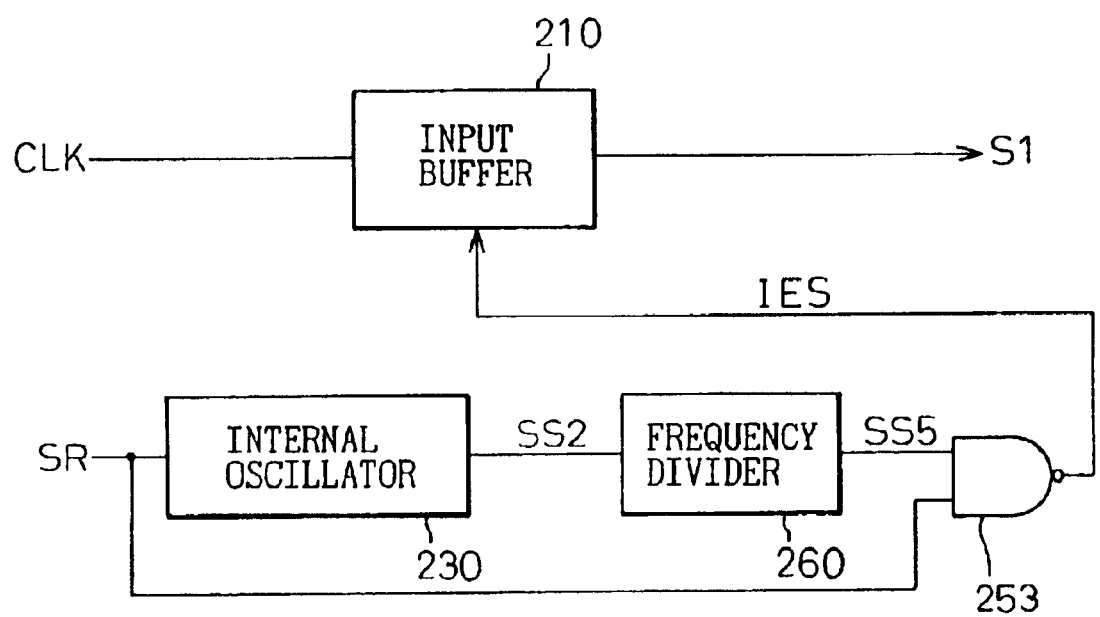
FIG. 29 shows an input circuit according to a third embodiment of the present invention.
Figure 30:
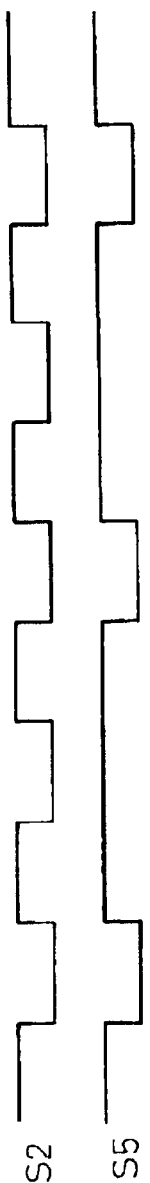
FIG. 30 is a timing chart showing the operation of a frequency divider of the input circuit of FIG. 29.

FIG. 29 shows an input circuit according to the third embodiment of the present invention, and FIG. 30 is a timing chart showing the operation of a frequency divider thereof.

An internal oscillator 230 provides an output signal SS2 whose frequency is divided by the frequency divider 260. The frequency divider 260 provides a frequency-divided output signal SS5 to a NAND gate 253. The NAND gate 253 provides a NAND of the signal SS5 and a self-refresh mode signal SR as an input buffer enable signal IES to control an input buffer 210.

In FIG. 30, the frequency divider 260 halves the frequency of the output signal SS2 of the internal oscillator 230 and supplies the frequency-halved signal SS5 to the NAND gate 253. A low-level period of the signal SS5 is ¼ of each signal period in FIG. 30. This further reduces the active period of the input buffer 210 that is activated during the low-level period of the signal SS5, thereby further reducing power consumption.

Figure 31:
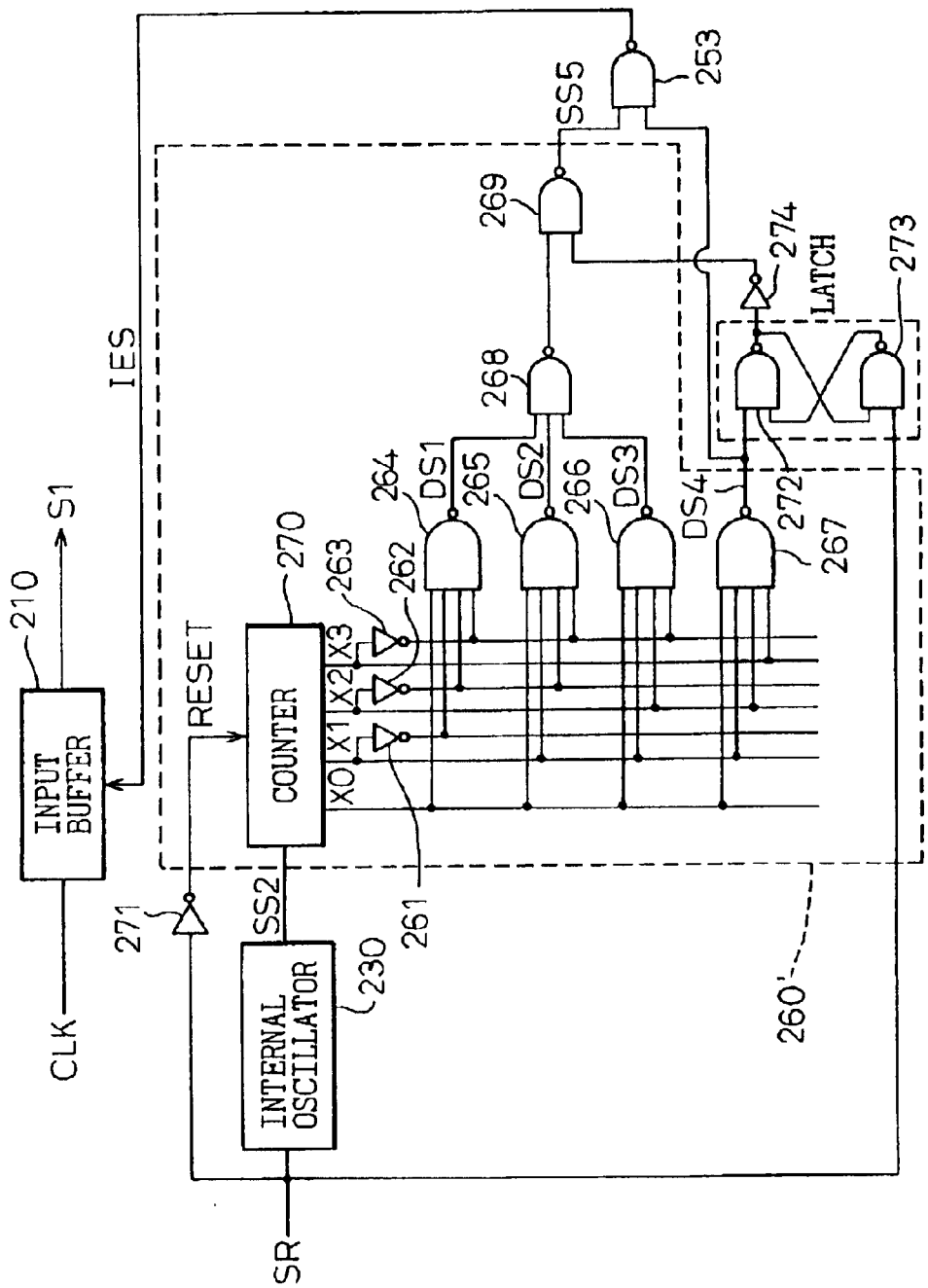
FIG. 31 shows an input circuit according to a fourth embodiment of the present invention.

FIG. 31 shows an input circuit according to the fourth embodiment of the present invention.

In a device such as a DRAM (SDRAM), the power consumption of a self-refresh mode is much smaller than that of an active mode. As a result, the temperature of the device (DRAM) greatly changes just after the start of the self-refresh mode and gradually settles. The fourth embodiment takes such temperature change into consideration and increases the frequency of phase adjusting operations just after the start of the self-refresh mode and decreases the same after a certain time, to reduce power consumption.

An internal oscillator 230 provides an output signal SS2 whose frequency is divided by a frequency divider 260'. The frequency divider 260' provides a frequency-divided signal SS5 to a NAND gate 253. The frequency dividing ratio of the frequency divider 260' changes as time passes, to reduce the frequency of an input buffer enable signal IES that is generated by the NAND gate 253.

The frequency divider 260' has a counter 270, inverters 261 to 263 for inverting outputs X1, X2, and X3 of the counter 270, NAND gates 264 to 267 for providing NANDs of outputs X0, X1, /X1, X2, /X2, X3, and /X3 of the counter 270, a NAND gate 268 for providing a NAND of the outputs of the NAND gates 264 to 266, and a NAND gate 269 for providing a NAND of the outputs of the NAND gate 268 and inverter 274. The output signal SS5 from the frequency divider 260' (NAND gate 269) and an output signal DS4 of the NAND gate 267 are supplied to the NAND gate 253, which provides the input buffer enable signal IES. The NAND gate 269 receives the output of an inverter 274 that inverts the output of a latch consisting of NAND gates 272 and 273. With this arrangement, the input buffer enable signal IES is generated at regular intervals after a set time (count). The counter 270 is, for example, a down-edge counter for counting the number of down edges of a signal. A reset terminal RESET of the counter 270 receives the output of an inverter 271 that inverts a self-refresh mode signal SR.

The counter 270 is reset when the self-refresh mode signal SR changes to low and starts a counting operation when the signal SR changes to high. The counter 270 counts down-edges in the output signal SS2 of the internal oscillator 230 from 0 to, for example, 16 (1111) and then restarts the counting of down-edges from 0.

Figure 32:
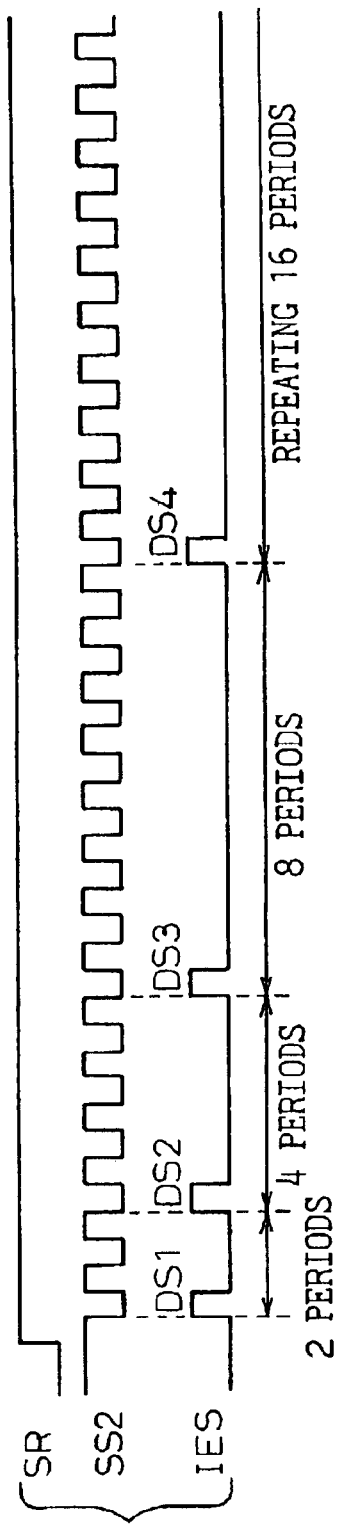
FIG. 32 is a timing chart showing the operation of the input circuit of FIG. 31.
Figure 33:
FIG. 33 shows a relationship between a counter output and an input buffer enable signal in the input circuit of FIG. 31.

FIG. 32 is a timing chart showing the operation of the input circuit of FIG. 31, and FIG. 33 shows a relationship between the output of the counter 270 and the input buffer enable signal IES.

When the self-refresh mode signal SR rises, the counter 270 starts a counting operation. As time passes, the NAND gate 253 provides one after another, as the input buffer enable signal IES, an output signal DS1 of the NAND gate 264 prepared by halving the frequency of the output signal SS2 of the internal oscillator 230, an output signal DS2 of the NAND gate 265 prepared by quartering the frequency of the signal SS2, an output signal DS3 of the NAND gate 266 prepared by dividing the frequency of the signal SS2 by 8, and an output signal DS4 of the NAND gate 267 prepared by dividing the frequency of the signal SS2 by 16. Once the signal DS4 is provided as the input buffer enable signal IES, the signal IES is kept as it is until the self-refresh mode signal SR falls. Namely, the input buffer enable signal IES is sequentially prepared from the signals DS1, DS2, DS3, and DS4 as time passes to reduce the frequency thereof. Once the signal DS4 starts to generate the signal IES, the signal DS4 is continuously used due to the latching operation of the NAND gates 272 and 273. The signal DS4 generates the signal IES once per 16 pulses of the output signal SS2 of the internal oscillator 230.

Instead of increasing the frequency dividing ratio of the frequency divider 260' step by step, the fourth embodiment may employ, for example, high and low frequency dividing ratios so that the frequency divider 260' may drop the frequency of the input buffer enable signal IES from high to low after a set time.

Figure 34:
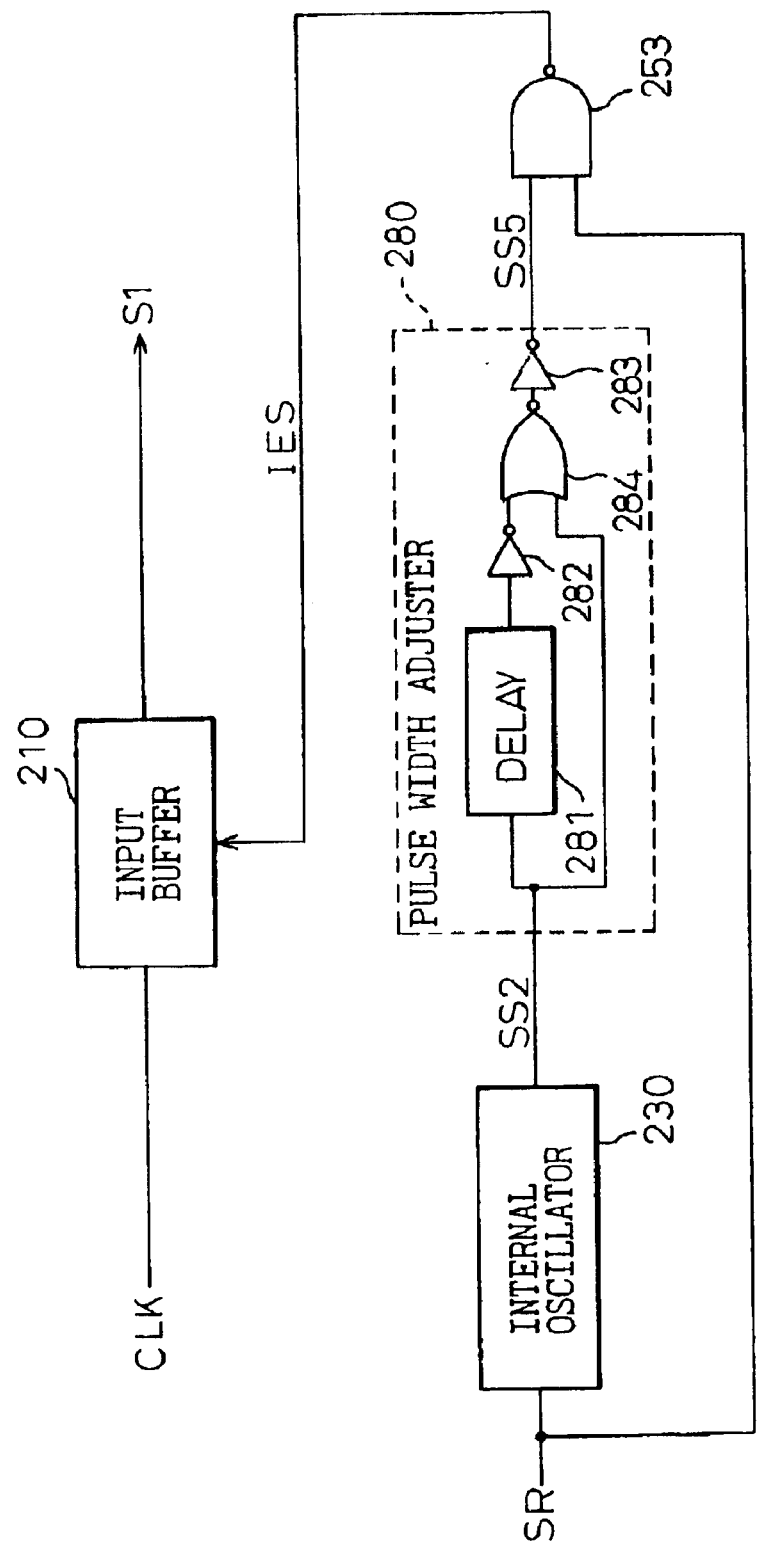
FIG. 34 shows an input circuit according to a fifth embodiment of the present invention.
Figure 35:
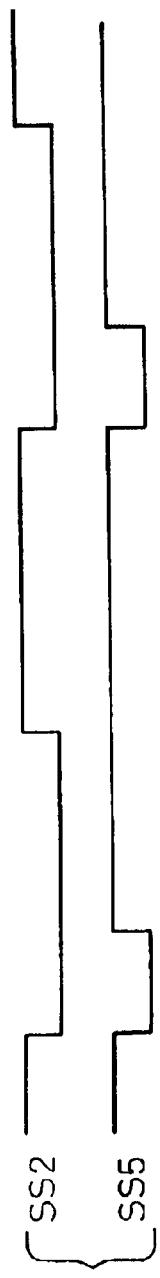
FIG. 35 is a timing chart showing the operation of a pulse width adjuster of the input circuit of FIG. 34.

FIG. 34 shows an input circuit according to the fifth embodiment of the present invention and FIG. 35 is a timing chart showing the operation of a pulse width adjuster thereof.

The input circuit has an internal oscillator 230, a NAND gate 253, and a pulse width adjuster 280 arranged between the elements 230 and 253.

The pulse width adjuster 280 has a delay unit 281, inverters 282 and 283, and a NOR gate 284. The pulse width adjuster 280 controls the pulse width (duty factor) of an output signal SS2 of the internal oscillator 230 and generates an output signal SS5, which is supplied to the NAND gate 253. The fifth embodiment optionally adjusts the low-level period of the output signal SS5 supplied to the NAND gate 253 with respect to the low-level period of the output signal SS2 from the internal oscillator 230. This further reduces the active period of an input buffer 210, i.e., the high-level period of an input buffer enable signal IES, thereby further reducing power consumption.

Figure 36:
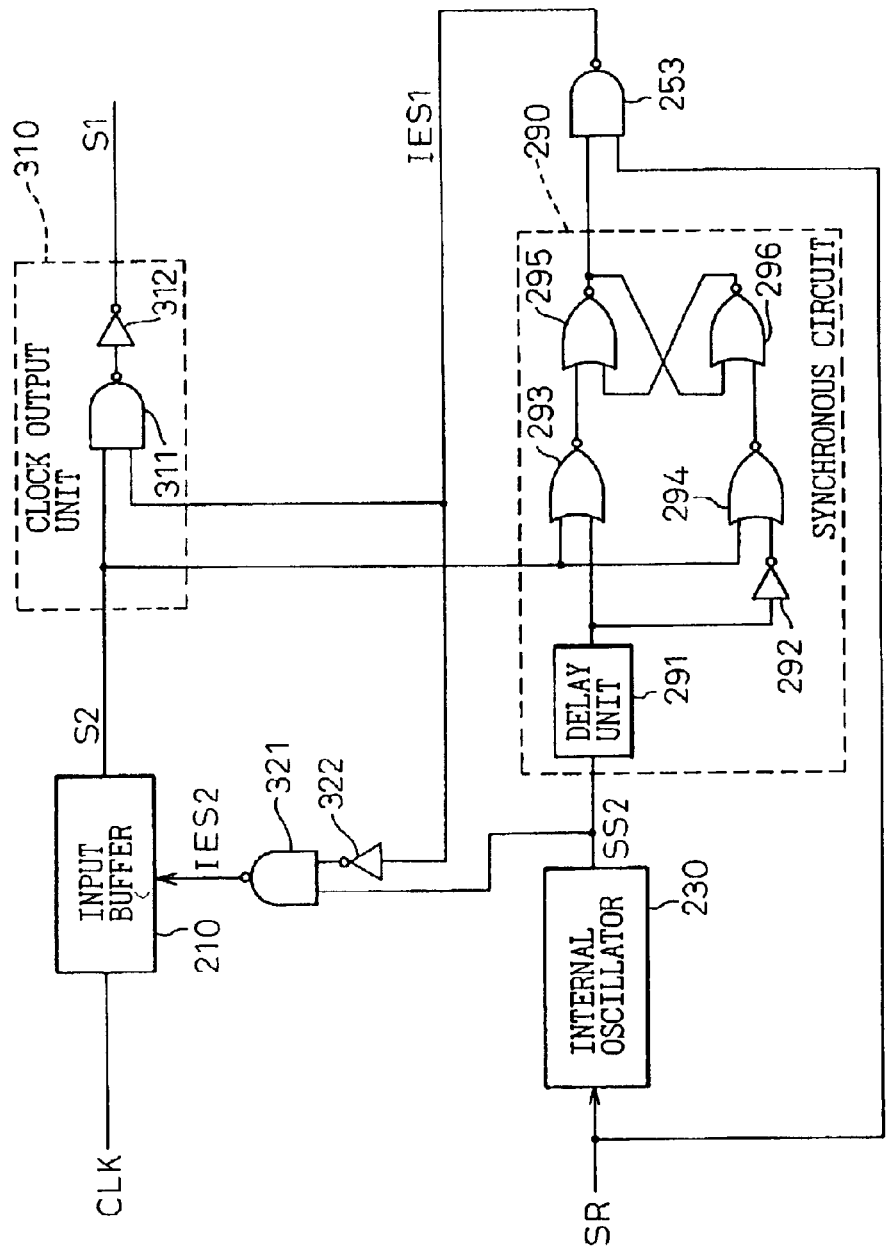
FIG. 36 shows an input circuit according to a sixth embodiment of the present invention.

FIG. 36 shows an input circuit according to the sixth embodiment of the present invention. This embodiment secures clear edges in an internal control signal (internal clock signal) S1.

The input circuit of the sixth embodiment has an internal oscillator 230, a NAND gate 253, and a synchronous circuit 290 arranged between the elements 230 and 253. The NAND gate 253 provides a first input buffer enable signal IES1 to an input terminal of a NAND gate 321 through an inverter 322. The other input terminal of the NAND gate 321 receives an output signal SS2 from the internal oscillator 230. The NAND gate 321 provides a second input buffer enable signal IES2 to an input buffer 210 to control the internal control signal S1. The input buffer 210 provides an internal control signal S2 to a clock output unit 310, which provides the signal S1.

The synchronous circuit 290 has a delay unit 291, an inverter 292, and NOR gates 293 to 296. The NOR gates 295 and 296 form a latch. The NOR gate 293 receives the output signal S2 of the input buffer 210 and the output signal SS2 of the internal oscillator 230 delayed by the delay unit 291. The NOR gate 294 receives the signal S2, as well as the signal SS2 delayed by the delay unit 291 and inverted by the inverter 292. The delay unit 291 adjusts the timing of the output signal SS2 with respect to the output signal S2 both supplied to the NOR gates 293 and 294. If the output signal SS2 is ahead of the output signal S2, the first input buffer enable signal IES1 is generated to miss an edge in the internal control signal S1. To prevent this, the delay unit 291 provides a delay corresponding to the input buffer 210.

Figure 37:
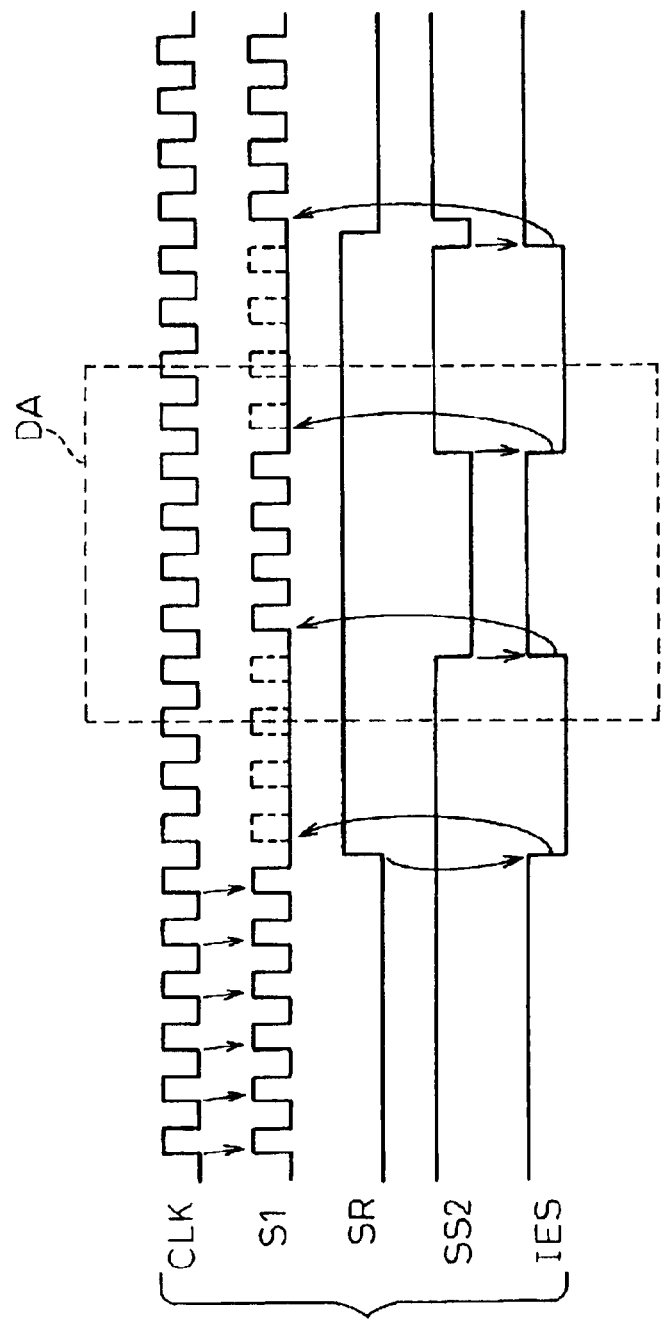
FIG. 37 is a timing chart showing the operation of the sixth to eighth embodiments of the present invention.

FIG. 37 is a timing chart showing the operation of the sixth to eighth embodiments of the present invention.

Figure 38:
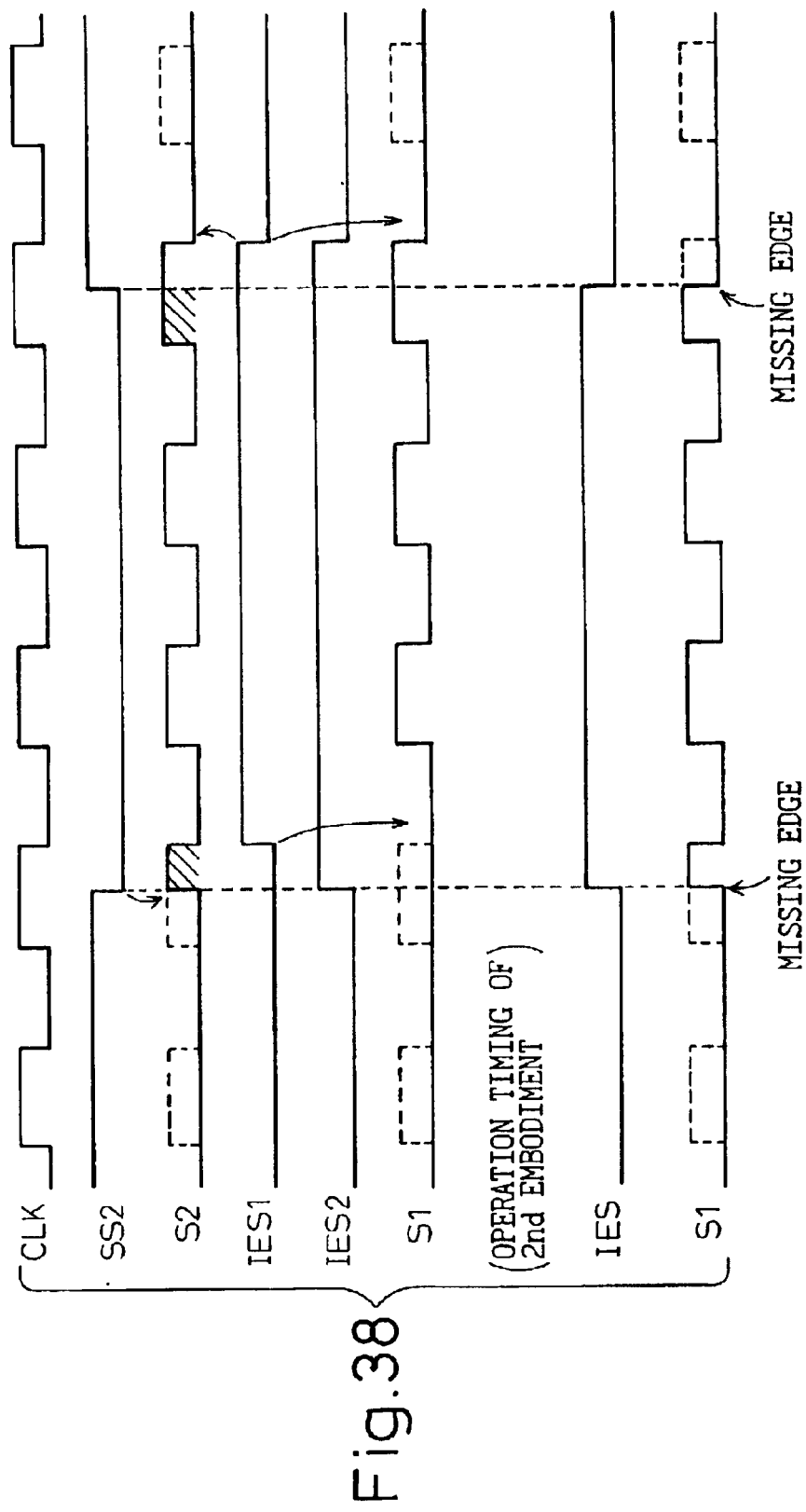
FIG. 38 is a timing chart showing the operation of the input circuit of FIG. 36.
Figure 40:
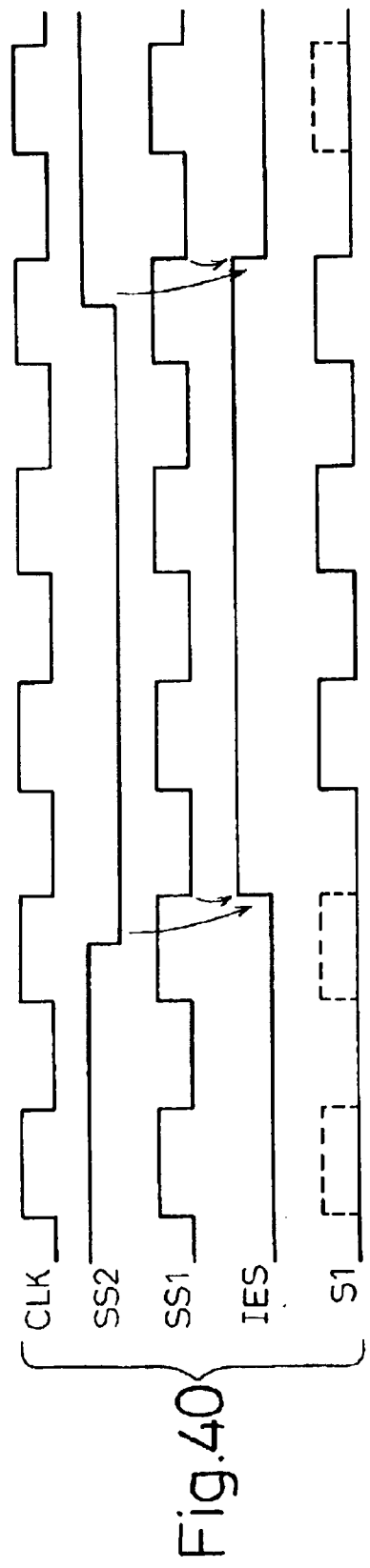
FIG. 40 is a timing chart showing the operation of the input circuit of FIG. 39.
Figure 42:
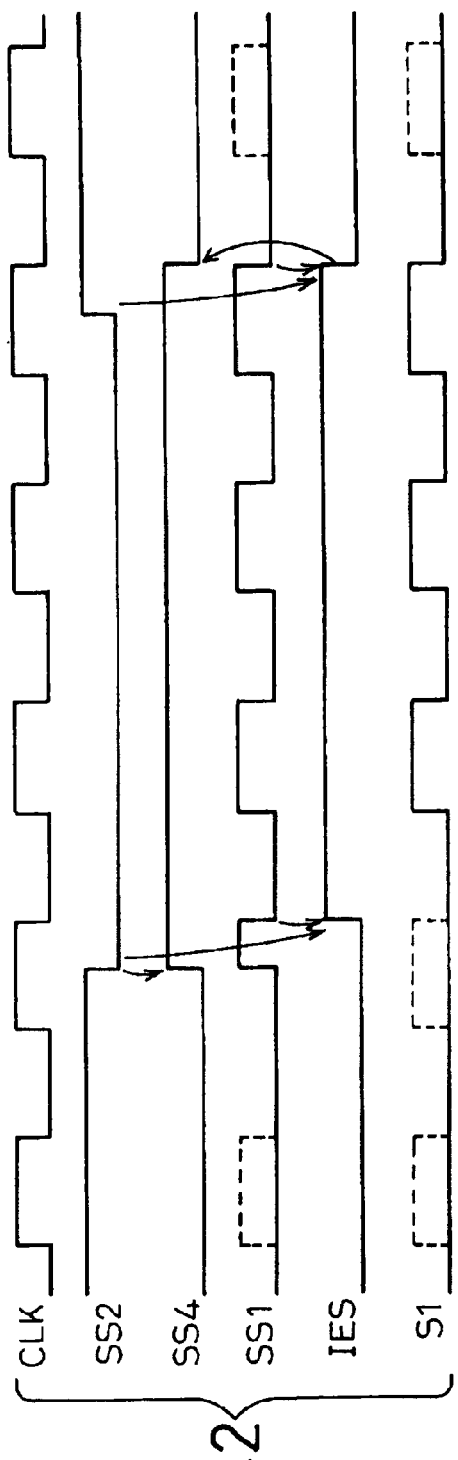
FIG. 42 is a timing chart showing the operation of the input circuit of FIG. 41.

A part encircled with a dotted line in FIG. 37 indicates each area shown in FIGS. 38, 40, and 42 for explaining the operation of the sixth to eighth embodiments.

FIG. 38 is a timing chart showing the operation of the input circuit of FIG. 36.

As shown in the lower part of FIG. 38, the second embodiment misses an edge of the internal control signal S1 when the input buffer enable signal IES rises. To solve this problem, the sixth embodiment employs the second input buffer enable signal IES2 so that, even if an edge of the output signal S2 of the input buffer 210 is missed, the internal control signal S1 provided by the clock output unit 310 has a specified pulse width without edge miss, as shown in the upper part of FIG. 38.

Figure 39:
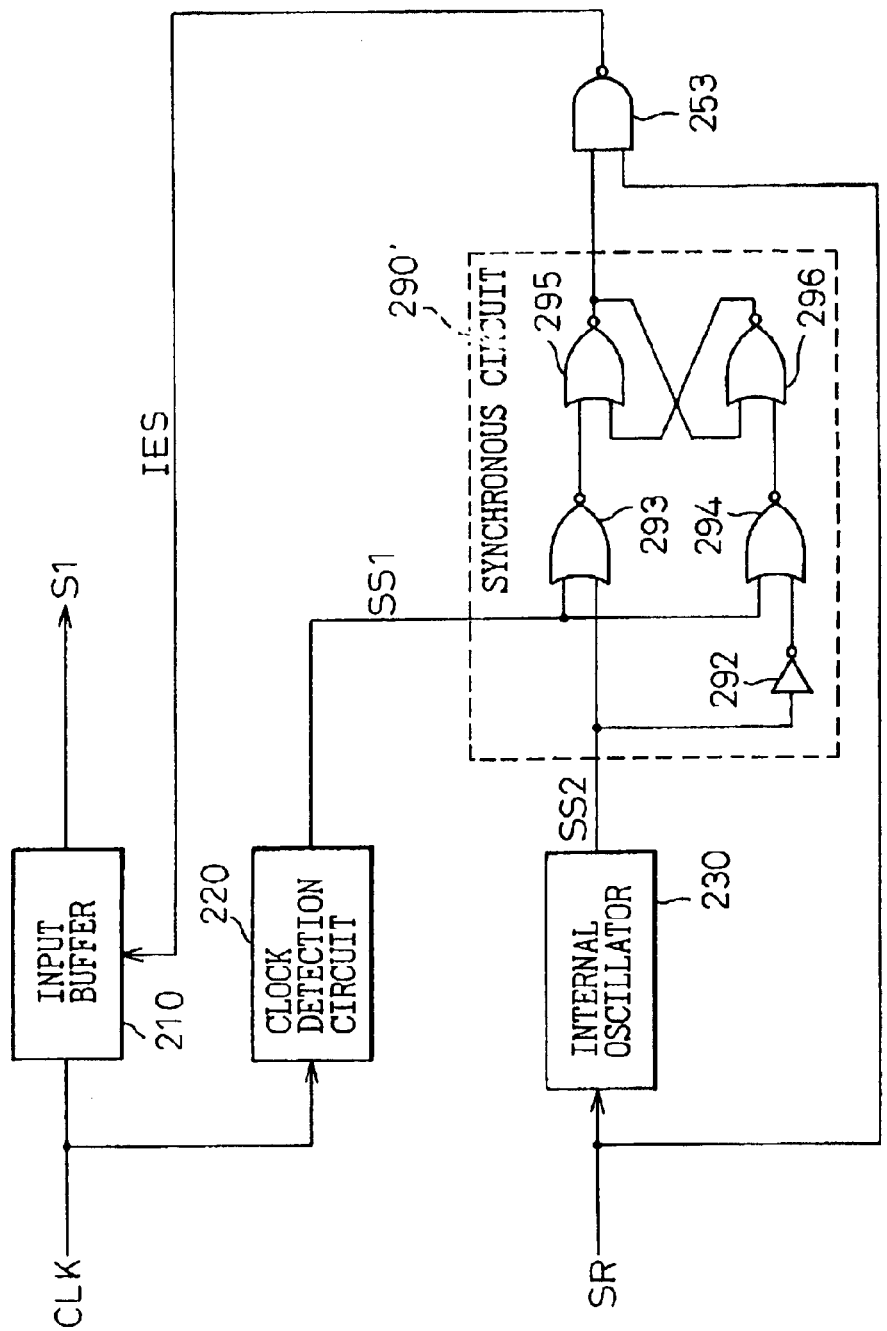
FIG. 39 shows an input circuit according to the seventh embodiment of the present invention.

FIG. 39 shows an input circuit according to the seventh embodiment of the present invention, and FIG. 40 is a timing chart showing the operation thereof.

In addition to the arrangement of the second embodiment of FIG. 27, the seventh embodiment employs a clock detection circuit 220, which activates an input buffer 210 only when detecting that an output signal SS2 of an internal oscillator 230 is low and an external control signal (external clock signal) CLK is operating. Compared with the synchronous circuit 290 of FIG. 36, a synchronous circuit 290' has no delay element 291 and receives an output signal SS1 of the clock detection circuit 220. The seventh embodiment reduces power consumption further than the second embodiment because the seventh embodiment inactivates the input buffer 210 if the external control signal CLK is inactive.

In addition, the synchronous circuit 290' of the seventh embodiment logically synthesizes the output signal SS1 of the clock detection circuit 220 and the output signal SS2 of the internal oscillator 230, and therefore, an internal control signal S1 provided by the seventh embodiment has perfect edges as shown in FIG. 40.

Figure 41:
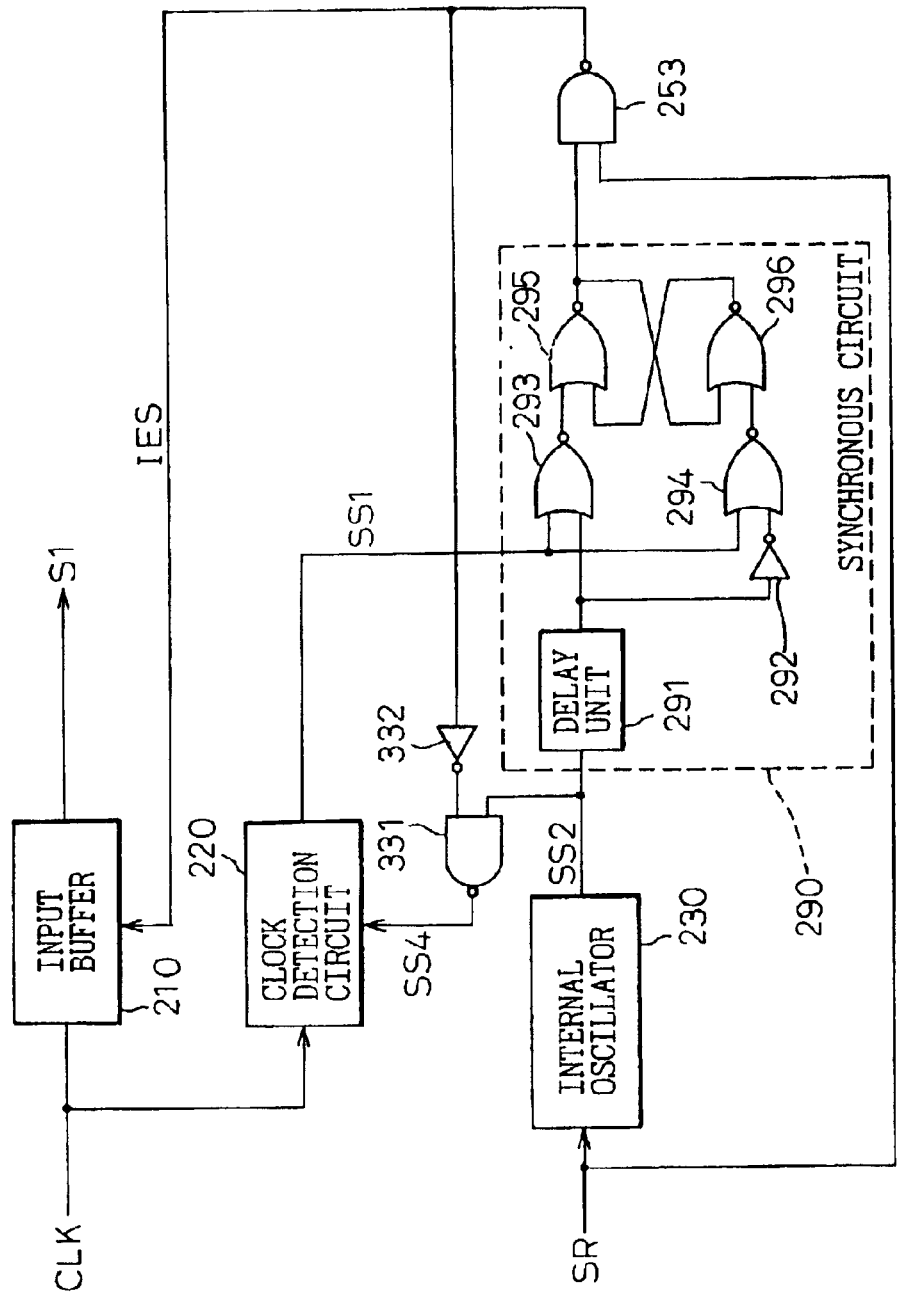
FIG. 41 shows an input circuit according to the eighth embodiment of the present invention.

FIG. 41 shows an input circuit according to the eighth embodiment of the present invention and FIG. 42 is a timing chart showing the operation thereof.

In addition to the seventh embodiment, the eighth embodiment employs an activation signal SS4, which is controlled by an output signal SS2 of an internal oscillator 230, to control a clock detection circuit 220 so that the clock detection circuit 220 is activated when the output signal SS2 is low. The output signal SS2 is supplied to an input terminal of a NAND gate 331. An input buffer enable signal IES is inverted by an inverter 332 and the inverted signal is supplied to another input terminal of the NAND gate 331. The NAND gate 331 provides the signal SS4 to control the activation of the clock detection circuit 220.

The eighth embodiment inactivates the clock detection circuit 220 if the output signal SS2 is high, thereby reducing power consumption further than the seventh embodiment. The eighth embodiment generates the activation signal SS4 from the output signal SS2 and input buffer enable signal IES to prevent the missing of edges (in particular, the last edge) in an internal control signal S1.

Figure 43:
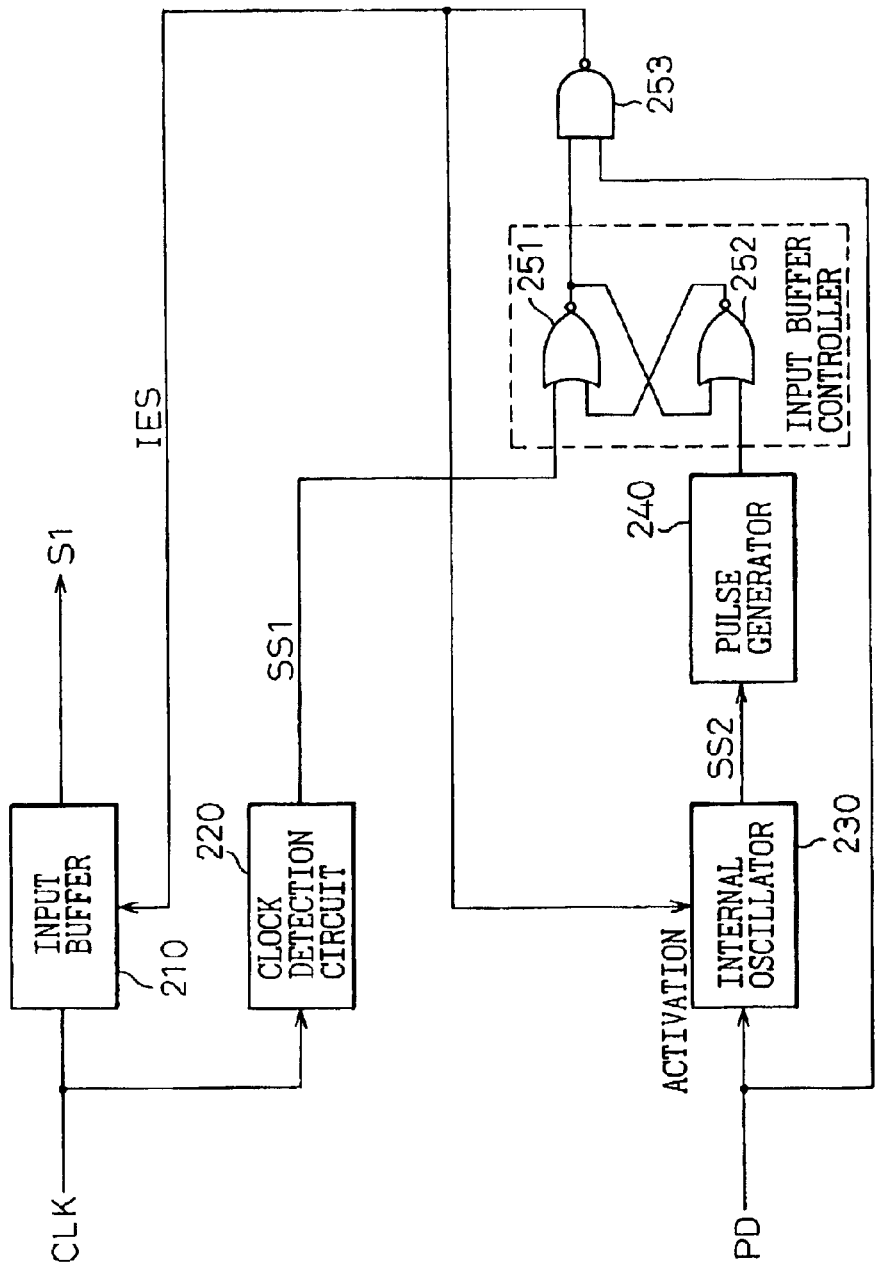
FIG. 43 shows an input circuit according to a ninth embodiment of the present invention.

FIG. 43 shows an input circuit according to the ninth embodiment of the present invention. This embodiment applies the first embodiment of FIG. 17 to a device that is not a DRAM.

The first embodiment mentioned above uses a self-refresh oscillator of a DRAM as the internal oscillator 230. In this case, the oscillator must not be stopped during a power-down mode (self-refresh mode) because the oscillator is also used for a self-refresh operation.

Unlike DRAMs, SRAMs and flash EEPROMs carry out no refreshing of memory cells, and therefore, oscillators (internal oscillator 230) in such devices may be stopped. The ninth embodiment controls the internal oscillator 230 with a power down signal PD and an input buffer enable signal IES so that the internal oscillator 230 is operated only when the input buffer 210 is active in a power down state. This further reduces power consumption.

Figure 44:
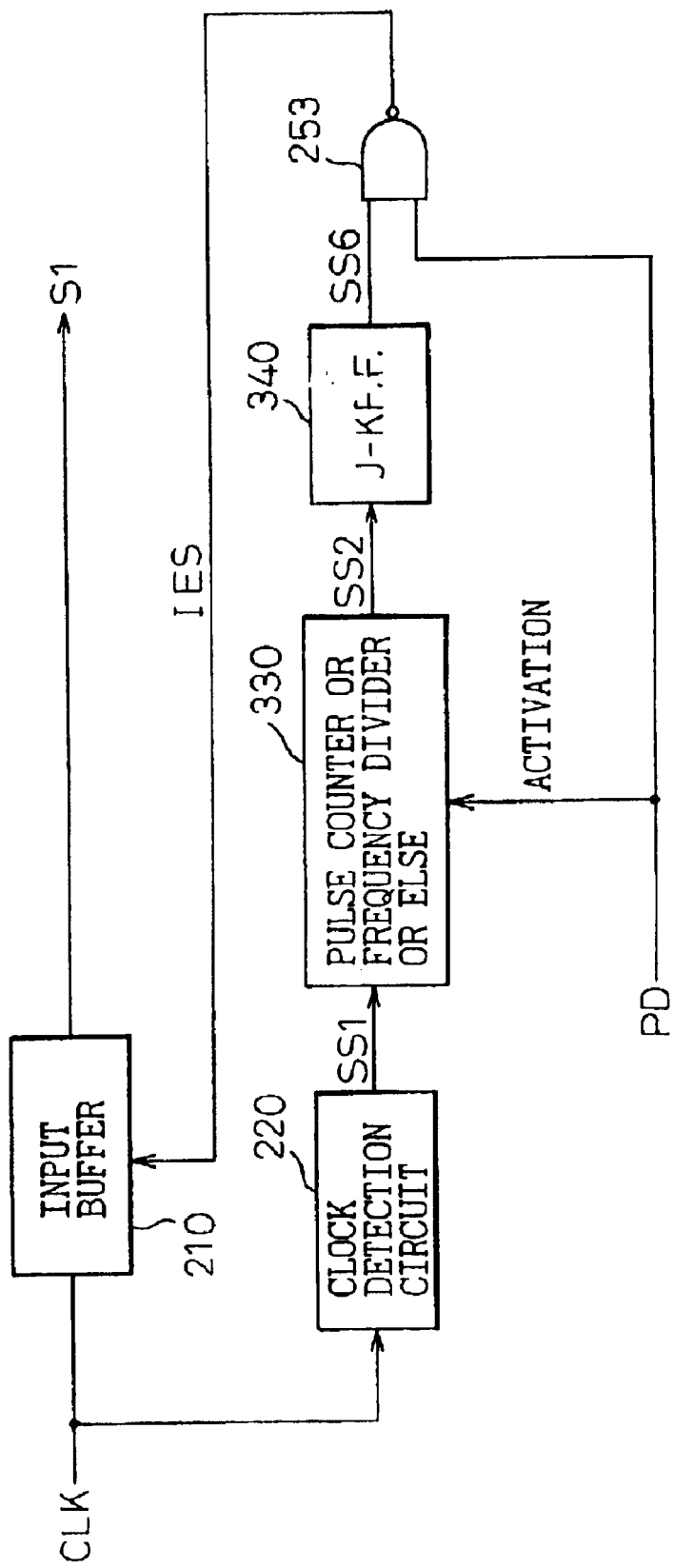
FIG. 44 shows an input circuit according to a tenth embodiment of the present invention.

FIG. 44 shows an input circuit according to the tenth embodiment of the present invention. This circuit has a pulse counter 330 (or a frequency divider, or else) and a J-K flip-flop 340.

A clock detection circuit 220 provides an output signal SS1 to the pulse counter 330, which provides an output signal SS2 to the J-K flip-flop 340. A NAND gate 253 receives an output signal SS6 of the J-K flop-flop 340 and a power down signal PD and provides an input buffer enable signal IES to control the activation of an input buffer 210. The pulse counter 330 receives the power down signal PD as an activation (enable) signal. The pulse counter 330 may count 256 pulses in the signal SS1 and then generates a pulse in the signal SS2. Instead of the signal SS1, the pulse counter 330 may receive an output signal S1 of the input buffer 210.

Figure 45:
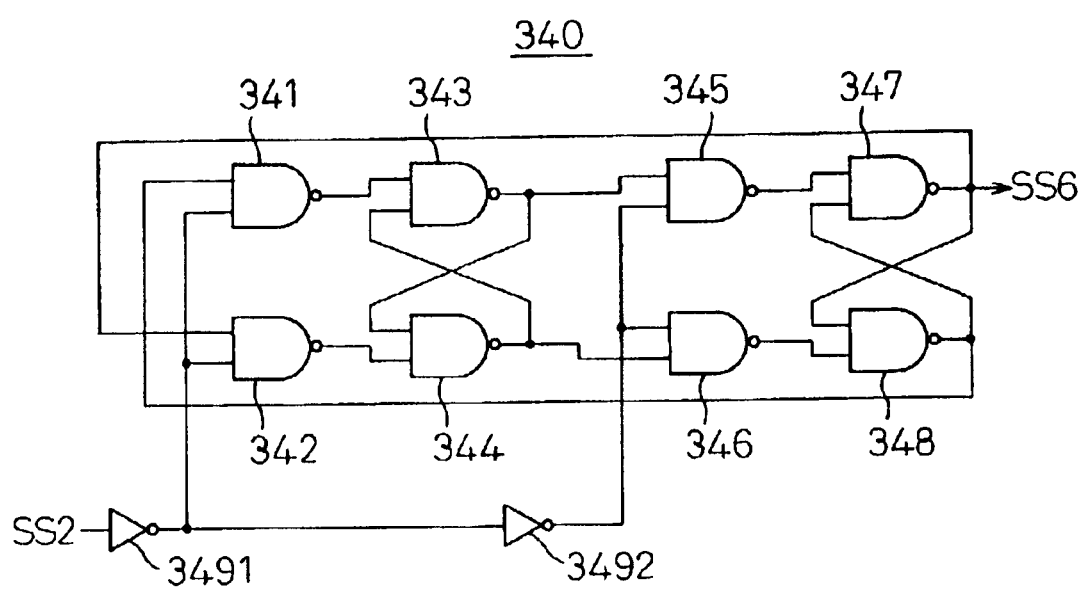
FIG. 45 shows an example of a J-K flip-flop of the input circuit of FIG. 44.
Figure 46:
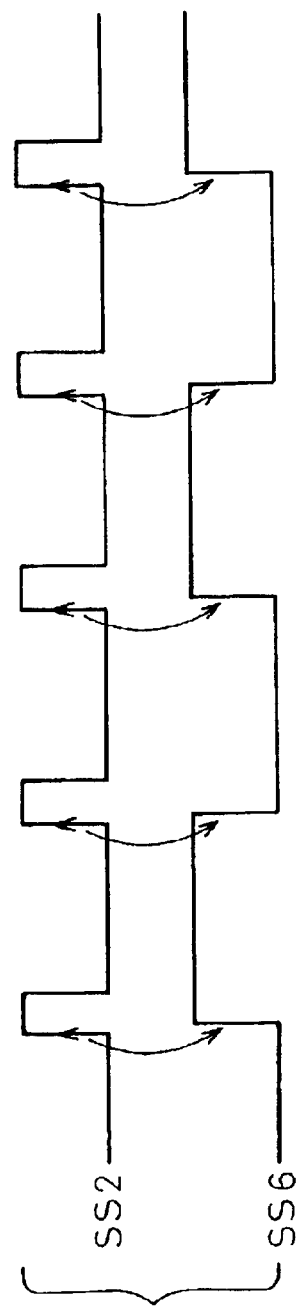
FIG. 46 is a timing chart showing the waveforms of input and output signals of the J-K flip-flop of FIG. 45.

FIG. 45 shows an example of the J-K flip-flop 340 and FIG. 46 is a timing chart showing examples of the waveforms of input and output signals of the J-K flip-flop.

The J-K flip-flop 340 has NAND gates 341 to 348 and inverters 3491 and 3492. The input signal SS2 and output signal SS6 of the J-K flip-flop 340 have the waveforms of FIG. 46.

Although the input circuit of the present invention is applied to synchronous DRAMs in the above explanation, it is applicable not only to the synchronous DRAMs but also to semiconductor integrated circuits having DLLs or PLLs that need a long lock-on time. Although a control signal for the input circuit of the present invention is a clock signal in the above explanation, it is not limited to the clock signal.

As explained above, the present invention shortens the lock-on time of an internal circuit (a synchronous circuit). In particular, the present invention immediately locks a clock signal provided by a DLL circuit without dummy cycles just after the completion of a self-refresh mode of a semiconductor integrated circuit such as a synchronous DRAM.

Many different embodiments of the present invention may be constructed without departing from the spirit and scope of the present invention, and it should be understood that the present invention is not limited to the specific embodiments described in this specification, except as defined in the appended claims.

What is claimed is:

1. An input circuit comprising:
   an input buffer receiving an external control signal and providing an internal control signal;
   a delay locked loop circuit receiving the internal control signal for adjusting a phase of the internal control signal; and
   a timing signal generator generating a timing signal, wherein:
      said input buffer provides the internal control signal for a predetermined period in response to the timing signal.

2. An input circuit as claimed in claim 1, wherein said timing signal generator includes an oscillator.

3. An input circuit as claimed in claim 2, wherein said timing signal generator further includes a frequency divider.

4. An input circuit as claimed in claim 3, wherein said frequency divider changes a frequency dividing ratio after a predetermined period.

5. An input circuit as claimed in claim 4, wherein said frequency divider lowers a frequency of the timing signal as time passes.

6. An input circuit as claimed in claim 2, wherein said timing signal generator further includes a pulse width adjuster for adjusting a pulse width of the timing signal.

7. An input circuit as claimed in claim 2, wherein said input circuit further comprises:
   an internal control signal output unit for receiving the internal control signal from said input buffer and providing the internal control signal for internal circuits; and
   a synchronous circuit for receiving the internal control signal from said input buffer and providing said internal control signal output unit with a timing signal synchronized with the internal control signal.

8. A semiconductor integrated circuit comprising:
   an input circuit receiving an external clock signal and providing an internal clock signal; and
   an internal circuit that receives the internal clock signal and takes a predetermined time to establish a steady state, wherein:
      said input circuit includes an input buffer generating the internal clock signal from the external control signal, a delay locked loop circuit receiving the internal clock signal for adjusting a phase of the internal clock signal, and a timing signal generator generating a timing signal; and
      said input buffer provides the internal clock signal for a predetermined period in response to the timing signal.

9. A semiconductor integrated circuit as claimed in claim 8, wherein said timing signal generator includes an oscillator.

10. A semiconductor integrated circuit as claimed in claim 9, wherein said timing signal generator further includes a frequency divider.

11. A semiconductor integrated circuit as claimed in claim 10, wherein said frequency divider changes a frequency dividing ratio after a predetermined period.

12. A semiconductor integrated circuit as claimed in claim 11, wherein said frequency divider lowers a frequency of the timing signal as time passes.

13. A semiconductor integrated circuit as claimed in claim 9, wherein said timing signal generator further includes a pulse width adjuster for adjusting a pulse width of the timing signal.

14. A semiconductor integrated circuit as claimed in claim 9, wherein said input circuit further comprises:
   an internal clock signal output unit for receiving the internal clock signal from said input buffer and providing the internal clock signal for said internal circuit; and
   a synchronous circuit for receiving the internal clock signal from said input buffer and providing said internal clock signal output unit with a timing signal synchronized with the internal clock signal.

15. A semiconductor integrated circuit as claimed in claim 9, wherein said semiconductor integrated circuit is a synchronous DRAM and said oscillator serves as a self-refresh oscillator.

16. A semiconductor integrated circuit as claimed in claim 15, wherein said timing signal generator generates no timing signal during a self-refresh operation.

17. An input circuit comprising:
   an input buffer receiving an external control signal and providing an internal control signal;
   a delay locked loop circuit receiving the internal control signal for adjusting a phase of the internal control signal;
   a timing signal generator generating a timing signal; and
   a control signal detection circuit providing a detection signal indicating whether or not the external control signal is activated, wherein said input buffer provides the internal control signal according to the timing signal and the detection signal.

18. An input circuit as claimed in claim 17, wherein said input buffer provides the internal control signal for a predetermined period and then stops the internal control signal in response to the timing signal.

19. An input circuit as claimed in claim 18, wherein said input circuit further comprises a synchronous circuit for synchronizing the timing signal with the detection signal.

20. An input circuit as claimed in claim 18, wherein said control signal detection circuit is stopped in response to the timing signal.

21. An input circuit as claimed in claim 17, wherein said timing signal generator includes an oscillator.

22. An input circuit as claimed in claim 21, wherein said timing signal generator further includes a frequency divider.

23. An input circuit as claimed in claim 22, wherein said frequency divider changes a frequency dividing ratio after a predetermined period.

24. An input circuit as claimed in claim 23, wherein said frequency divider lowers a frequency of the timing signal as time passes.

25. An input signal as claimed in claim 21, wherein said timing signal generator further includes a pulse width adjuster for adjusting a pulse width of the timing signal.

26. An input circuit as claimed in claim 17, wherein said timing signal generator generates the timing signal by lowering the frequency of the external control signal.

27. A semiconductor integrated circuit comprising:
an input circuit receiving an external clock signal and providing an internal clock signal; and
an internal circuit that receives the internal clock signal and takes a predetermined time to establish a steady state, wherein:
said input circuit includes an input buffer providing the internal clock signal according to the external clock signal, a delay locked loop circuit receiving the internal clock signal for adjusting a phase of the internal clock signal, a timing signal generator generating a timing signal, and a clock signal detection circuit providing a detection signal indicating whether or not the external clock signal is activated; and
said input buffer provides the internal clock signal according to the timing signal and the detection signal.

28. A semiconductor integrated circuit as claimed in claim 27, wherein said input buffer provides the internal clock signal for a predetermined period and then stops the internal clock signal in response to the timing signal.

29. A semiconductor integrated circuit as claimed in claim 28, wherein said input circuit includes a synchronous circuit for synchronizing the timing signal with the detection signal.

30. A semiconductor integrated circuit as claimed in claim 28, wherein said clock signal detection circuit is stopped in response to the timing signal.

31. A semiconductor integrated circuit as claimed in claim 27, wherein said timing signal generator includes an oscillator.

32. A semiconductor integrated circuit as claimed in claim 31, wherein said timing signal generator further includes a frequency divider.

33. A semiconductor integrated circuit as claimed in claim 32, wherein said frequency divider changes a frequency dividing ratio after a predetermined period.

34. A semiconductor integrated circuit as claimed in claim 33, wherein said frequency divider lowers a frequency of the timing signal as time passes.

35. A semiconductor integrated circuit as claimed in claim 31, wherein said timing signal generator further includes a pulse width adjuster for adjusting a pulse width of the timing signal.

36. A semiconductor integrated circuit as claimed in claim 27, wherein said timing signal generator generates the timing signal by lowering a frequency of the external clock signal.

37. An input circuit comprising:
an input buffer for receiving an external control signal and providing an internal control signal;
a timing signal generator for generating a timing signal;
a control signal detection circuit for providing a detection signal indicating whether or not the external control signal is activated, the internal control signal is started and stopped in response to the timing signal;
an input buffer controller for generating an input buffer control signal according to the detection signal;
said input buffer provides the internal control signal according to the timing signal and the detection signal, or the input buffer control signal; and
said input buffer controller includes a latch, generates the input buffer control signal according to the detection signal, latches the same, and releases the latched state according to the timing signal.

38. An input circuit as claimed in claim 37, wherein said timing signal generator starts to operate in response to the detection signal and stops operating after providing the timing signal.

39. An input circuit as claimed in claim 37, wherein said timing signal generator includes an oscillator.

40. An input circuit as claimed in claim 37, wherein said timing signal generator generates the timing signal by lowering a frequency of the external control signal.

41. A semiconductor integrated circuit comprising:
an input circuit for receiving an external clock signal and providing an internal clock signal; and
an internal circuit that receives the internal clock signal and takes a predetermined time to establish a steady state;
said input circuit includes, a timing signal generator for generating a timing signal, and a clock signal detection circuit for providing a detection signal indicating whether or not the external clock signal is activated, the internal clock signal is started and stopped in response to the timing signal;
said input circuit further includes an input buffer controller for generating an input buffer control signal according to the detection signal; and
an input buffer for providing the internal clock signal according to the external clock signal, the detection signal or the input buffer control signal; and
said input buffer controller includes a latch, generates the input buffer control signal according to the detection signal, latches the same, and releases the latched state according to the timing signal.

42. A semiconductor integrated circuit as claimed in claim 41, wherein said timing signal generator starts to operate in response to the detection signal and stops operating after providing the timing signal.

43. A semiconductor integrated circuit as claimed in claim 41, wherein said timing signal generator includes an oscillator.

44. A semiconductor integrated circuit as claimed in claim 41, wherein said timing signal generator generates the timing signal by lowering a frequency of the external clock signal.

45. An input circuit comprising:
an input buffer receiving an external control signal and providing an internal control signal;
a self timing control circuit receiving the internal control signal for adjusting a phase of the internal control signal; and
a timing signal generator generating a timing signal, wherein:
said input buffer provides the internal control signal for a predetermined period in response to the timing signal.

46. A semiconductor integrated circuit comprising:
an input circuit receiving an external clock signal and providing an internal clock signal; and
an internal circuit that receives the internal clock signal and takes a predetermined time to establish a steady state, wherein:
said input circuit includes an input buffer generating the internal clock signal from the external control signal, a self timing control circuit receiving the internal clock signal for adjusting a phase of the internal clock signal, and a timing signal generator generating a timing signal; and
said input buffer provides the internal clock signal for a predetermined period in response to the timing signal.

47. An input circuit comprising:

an input buffer receiving an external control signal and providing an internal control signal;

a self timing control circuit receiving the internal control signal for adjusting a phase of the internal control signal;

a timing signal generator generating a timing signal; and a control signal detection circuit providing a detection signal indicating whether or not the external control signal is activated, wherein said input buffer provides the internal control signal according to the timing signal and the detection signal.

48. A semiconductor integrated circuit comprising:

an input circuit receiving an external clock signal and providing an internal clock signal; and an internal circuit that receives the internal clock signal and takes a predetermined time to establish a steady state, wherein:

said input circuit includes an input buffer providing the internal clock signal according to the external clock signal, a self timing control circuit receiving the internal clock signal for adjusting a phase of the internal clock signal, a timing signal generator generating a timing signal, and a clock signal detection circuit providing a detection signal indicating whether or not the external clock signal is activated; and said input buffer provides the internal clock signal according to the timing signal and the detection signal.

49. An input circuit comprising:

an input buffer for receiving an external control signal and providing an internal control signal;

a timing signal generator for generating a timing signal;

a control signal detection circuit for providing a detection signal indicating whether or not the external control signal is activated, wherein said input buffer provides the internal control signal according to the timing signal and the detection signal and the internal control signal is started and stopped in response to the timing signal; and an input buffer controller for generating an input buffer control signal according to the detection signal;

said input buffer provides the internal control signal according to the input buffer control signal; and said input buffer controller includes a latch, generates the input buffer control signal according to the detection signal, latches the same, and releases the latched state according to the timing signal, wherein said timing signal generator generates the timing signal by lowering a frequency of the external control signal.

50. A semiconductor integrated circuit comprising:

an input circuit for receiving an external clock signal and providing an internal clock signal;

an internal circuit that receives the internal clock signal and takes a predetermined time to establish a steady state, wherein said input circuit includes an input buffer for providing the internal clock signal according to the external clock signal, a timing signal generator for generating a timing signal, and a clock signal detection circuit for providing a detection signal indicating whether or not the external clock signal is activated; wherein said input buffer provides the internal clock signal according to the detection signal and the internal clock signal is started and stopped in response to the timing signal; and an input buffer controller for generating an input buffer control signal according to the detection signal;

said input buffer provides the internal clock signal according to the input buffer control signal; and said input buffer controller includes a latch, generates the input buffer control signal according to the detection signal, latches the same, and releases the latched state according to the timing signal, wherein said timing signal generator generates the timing signal by lowering a frequency of the external clock signal.

* * * * *